US009284133B2

(12) United States Patent
Theriault et al.

(10) Patent No.: US 9,284,133 B2
(45) Date of Patent: Mar. 15, 2016

(54) CONVEYOR SYSTEM AND METHOD

(71) Applicant: CONCEPTION IMPACK DTCI INC., Saint-Jacques (CA)

(72) Inventors: Dominic Theriault, Saint-Jacques (CA); Mathieu Tremblay, Laval (CA); Jonathan Lemay, Sainte-Anne-des-Plaines (CA)

(73) Assignee: CONCEPTION IMPACK DTCI INC., Saint-Jacques, Quebec (CA)

( * ) Notice: Subject to any disclaimer, the term of this patent is extended or adjusted under 35 U.S.C. 154(b) by 0 days.

(21) Appl. No.: 14/266,078

(22) Filed: Apr. 30, 2014

(65) Prior Publication Data

US 2014/0291113 A1 Oct. 2, 2014

Related U.S. Application Data

(63) Continuation of application No. PCT/CA2012/050778, filed on Nov. 1, 2012.

(60) Provisional application No. 61/628,475, filed on Nov. 1, 2011, provisional application No. 61/578,497, filed on Dec. 21, 2011.

(51) Int. Cl.
*B65H 29/58* (2006.01)
*B65G 47/64* (2006.01)
(Continued)

(52) U.S. Cl.
CPC .............. *B65G 47/644* (2013.01); *B65G 15/14* (2013.01); *B65G 37/00* (2013.01); *B65H 29/12* (2013.01);
(Continued)

(58) Field of Classification Search
CPC ...... B65G 15/14; B65G 47/644; B65H 29/58; B65H 29/66
See application file for complete search history.

(56) References Cited

U.S. PATENT DOCUMENTS 3,773,319 A 11/1973 Hottendorf et al.
4,161,092 A * 7/1979 Buday .................. B65B 25/141
53/244
(Continued)

FOREIGN PATENT DOCUMENTS

EP 932129 B1 6/2003
GB 549067 A 11/1942
(Continued)

OTHER PUBLICATIONS

IPRP of PCT/CA2012/050778 from the Canadian Intellectual Property Office (IPEA/CA) dated Oct. 29, 2013.

*Primary Examiner* — Gene Crawford
*Assistant Examiner* — Thomas Randazzo
(74) *Attorney, Agent, or Firm* — IPAXIO S.E.N.C.

(57) ABSTRACT

The conveyor system is provided for carrying a shingled stream of items along at least two possible transport paths. The conveyor system includes an incoming endless-belt conveyor unit. The downstream end portion of the incoming conveyor unit includes a first conveyor belt and a second conveyor belt forming juxtaposed first and second conveyor belt runs between which the items are frictionally engaged when carried along the incoming portion of the transport paths. A diverter is provided within the downstream end portion of the incoming conveyor unit. The diverter includes at least one diverter segment pivotable around a transversal pivot axis, each diverter segment supporting one of the first rollers for the first conveyor belt run and one of the second rollers for the second conveyor belt run. A method of minimizing the length of a diverter in a conveyor system is also disclosed.

16 Claims, 21 Drawing Sheets

(51) Int. Cl.
*B65H 29/12* (2006.01)
*B65H 29/66* (2006.01)
*B65G 37/00* (2006.01)
*B65G 15/14* (2006.01)
*G06F 17/50* (2006.01)

(52) U.S. Cl.
CPC ............ *B65H 29/58* (2013.01); *B65H 29/66* (2013.01); *G06F 17/50* (2013.01); *B65H 2404/2613* (2013.01); *B65H 2404/2691* (2013.01); *B65H 2701/1766* (2013.01); *Y10T 29/49826* (2015.01)

(56) References Cited

U.S. PATENT DOCUMENTS

| | | | | |
|---|---|---|---|---|
| 4,235,434 A * | 11/1980 | Muller | ............ | B65H 1/22 271/280 |
| 4,447,052 A | 5/1984 | Muller | | |
| 4,747,817 A | 5/1988 | Newsome | | |
| 4,919,027 A * | 4/1990 | Littleton | ............ | B65H 29/58 271/182 |
| 5,150,894 A * | 9/1992 | Ricciardi | ............ | B07C 3/08 271/179 |
| 5,195,741 A * | 3/1993 | Stauber | ............ | B65H 29/58 271/285 |
| 5,205,704 A * | 4/1993 | Frost | ............ | B65H 3/042 198/861.3 |
| 5,346,206 A * | 9/1994 | Steinhart | ............ | B65H 29/60 271/182 |
| 5,467,976 A * | 11/1995 | Doucet | ............ | B65H 29/58 271/184 |
| 6,155,400 A | 12/2000 | Daigh et al. | | |
| 6,176,485 B1 * | 1/2001 | Wingate | ............ | B65H 29/12 271/303 |
| 6,594,974 B2 | 7/2003 | Theriault | | |
| 6,792,741 B1 | 9/2004 | Theriault | | |
| 7,360,636 B2 * | 4/2008 | Theriault | ............ | B65G 47/252 198/402 |
| 7,624,855 B2 | 12/2009 | Martocchio et al. | | |
| 7,788,887 B2 | 9/2010 | Baenninger | | |
| 7,967,124 B2 | 6/2011 | Theriault | | |
| 8,066,284 B2 * | 11/2011 | Choi et al. | ............ | 271/303 |
| 8,443,957 B2 | 5/2013 | Theriault | | |
| 8,789,683 B2 * | 7/2014 | Gadliger | ............ | B65H 29/58 198/370.08 |
| 2010/0006393 A1 * | 1/2010 | LeCroy | ............ | 198/370.02 |
| 2010/0072025 A1 * | 3/2010 | Chung | ............ | B65G 47/648 198/369.1 |
| 2013/0313082 A1 * | 11/2013 | Laaksonen | ............ | B65G 21/08 198/837 |

FOREIGN PATENT DOCUMENTS

| | | |
|---|---|---|
| JP | 60228352 A | 11/1985 |
| WO | 2013063701 A1 | 5/2013 |

* cited by examiner

# CONVEYOR SYSTEM AND METHOD

CROSS REFERENCE TO PRIOR APPLICATIONS

The present application is a continuation of PCT patent application No. PCT/CA2012/050778 filed on 1 Nov. 2012. PCT patent application No. PCT/CA2012/050778 claims priority to U.S. provisional patent application No. 61/628,475 filed on 1 Nov. 2011 and to U.S. provisional patent application No. 61/578,497 filed 21 Dec. 2011. The contents of all these prior applications are hereby incorporated by reference in their entirety.

TECHNICAL FIELD

The technical field relates generally to conveyor systems for carrying a shingle of items. The technical field also relates to the design of a conveyor system for a shingled stream of items.

BACKGROUND

Some conveyor systems are provided to handle overlapping substantially flat items to be carried along a transport path. Examples of such items include packages provided in the form of folded boxes coming out of a folding and gluing machine. Some of these packages have a non-uniform thickness and a non-symmetrical shape when folded. Handling these items using conveyors can be challenging in some cases, particularly when high volumes and high speeds are involved. For instance, such items are often prone to slippage with reference to one another, especially when the conveyor system accelerates and decelerates. This slippage can cause local shifts in the relative position of items, thereby creating local variations in thickness. These variations in thickness of the shingled stream along its length generally complicate the handling of the items.

Items handled in conveyor systems have a certain degree of flexibility, which depends on various factors such as the material used, the orientation of the material, etc. However, when a maximum bending angle of an item is exceeded somewhere along a transport path, a plastic deformation will occur and this can often leave a visible trace somewhere on the items, usually in the form of a transversal crease on at least one of its major sides. This somewhat alters the aesthetic aspect of the items and is thus generally undesirable.

Conveyor systems may sometimes include a mechanism for selectively directing some successive items in one direction and other successive items in at least one other direction. U.S. Pat. No. 7,360,636 (Theriault) issued 22 Apr. 2008, the contents of which is hereby incorporated by reference, discloses an example of an apparatus including a conveyor system for handling a shingle of items. This apparatus can automatically alternate the orientation of the items so as to optimize the storage space when they are stacked, for instance inside a shipping box. The apparatus includes a diverter in the form of a flap whose position directs the items in one among two possible transport paths.

One of the main advantages of using a flap is that it is simple. However, the items are unsupported when passing around the flap and this may create some difficulties if the items are relatively short in length, especially if their length is less than the distance between the incoming conveyor and the corresponding outgoing conveyor. Reducing the distance between the two conveyors can solve this problem. However, decreasing the distance will increase the bending angle to which the items are subjected when passing through one or more of the possible transport paths, thereby increasing the risks of exceeding the maximum bending angle somewhere within the conveyor system.

Another possible approach for selectively directing a shingled stream of items through two or more possible transport paths is to provide an actuated arrangement at the downstream end portion of the incoming conveyor that can be selectively repositioned to be in registry with the selected outgoing conveyor. Such arrangement is called hereafter a "diverter". In practice, the space available for the diverter can often be very limited and providing such diverter can be challenging. Even when the available space is not an issue, minimizing the length of the diverter is still generally desirable, for instance to reduce manufacturing costs, weight and complexity. An excessively long diverter would require more powerful actuators and will take a longer time to be repositioned compared to a shorter one.

Accordingly, there is still room for improvements in this area of technology.

SUMMARY

In the proposed approach, the items passing through a diverter along at least one of the possible transport paths are subjected to a curvature at or close to the maximum bending angle but without exceeding it. This way, the length of the diverter can be minimized.

In one aspect, there is provided a conveyor system for carrying a shingled stream of items along at least two possible transport paths, the items having a maximum bending angle above which a plastic deformation occurs on at least some of the items, the conveyor system including: a pair of juxtaposed outgoing endless-belt conveyor units, each defining a corresponding outgoing portion of the transport paths; an incoming endless-belt conveyor unit having a downstream end portion and defining an incoming portion of the transport paths, the downstream end portion of the incoming endless-belt conveyor unit including a first conveyor belt and a second conveyor belt forming juxtaposed first and second conveyor belt runs between which the items are frictionally engaged when carried along the incoming portion of the transport paths, the first and second conveyor belt runs being supported by a plurality of corresponding lengthwise-disposed first and second rollers, respectively; and a diverter provided within the downstream end portion of the incoming conveyor unit, the diverter being selectively movable between two angular positions, each angular position corresponding to one of the transport paths, the diverter including a plurality of diverter segments that are lengthwise juxtaposed with reference to one another and that are each pivotally mounted around a corresponding transversal pivot axis, each diverter segment supporting one of the first rollers for the first conveyor belt run and one of the second rollers for the second conveyor belt run, the first roller of each diverter segment being urged towards the second conveyor belt run using at least one biasing device carried by the corresponding diverter segment, each biasing device generating a biasing force that is independent of the angular position of the corresponding diverter segment.

In another aspect, there is provided a conveyor system for carrying a shingled stream of items along at least two possible transport paths, the items having a maximum bending angle above which a plastic deformation occurs on at least some of the items, the conveyor system including: a pair of juxtaposed outgoing endless-belt conveyor units, each defining a corresponding outgoing portion of the transport paths; an incoming endless-belt conveyor unit having a downstream end portion and defining an incoming portion of the transport paths, the downstream end portion of the incoming endless-belt conveyor unit including a first conveyor belt and a second conveyor belt forming juxtaposed first and second conveyor belt runs between which the items are frictionally engaged when carried along the incoming portion of the transport paths, the first and second conveyor belt runs being supported by a plurality of corresponding lengthwise-disposed first and second rollers, respectively; and a diverter provided within the downstream end portion of the incoming conveyor unit, the diverter being selectively movable between two angular positions, each angular position corresponding to one of the transport paths, the diverter being configured and sized to have a substantially minimal overall length by having the shingled stream of items curved substantially at the maximum bending angle in the incoming portion of at least one of the transport paths, the diverter including at least one diverter segment pivotable around a transversal pivot axis, each diverter segment supporting one of the first rollers for the first conveyor belt run and one of the second rollers for the second conveyor belt run, the first roller of each diverter segment being urged towards the second conveyor belt run using at least one biasing device carried by the corresponding diverter segment, each biasing device generating a biasing force that is independent of the angular position of the corresponding diverter segment.

In another aspect, there is provided a method of minimizing the length of a diverter in a conveyor system provided for advancing a shingled stream of items in a direction of travel, the items coming through an incoming conveyor unit and exiting through a selected one among two juxtaposed outgoing conveyor units, the method including: determining a maximum bending angle of shingled stream of items, with reference to a tangent axis, above which a plastic deformation is likely to occur; determining a minimum vertical height between inlet ends of the two outgoing conveyor units; assuming a first number of lengthwise juxtaposed segment(s) for the diverter and that the shingled stream of items is curved substantially at the maximum bending angle inside the incoming conveyor unit when exiting through one of the outgoing conveyor units; determining a length for each segment using the first number; and determining again the length for each segment using at least one different number of lengthwise juxtaposed segment(s) than the first number while still assuming that the shingled stream of items is curved substantially at the maximum bending angle inside the incoming conveyor unit when exiting through one of the outgoing conveyor units.

Further details on these aspects as well as other aspects of the proposed concept will be apparent from the following detailed description and the appended figures.

DETAILED DESCRIPTION

Figure 1:
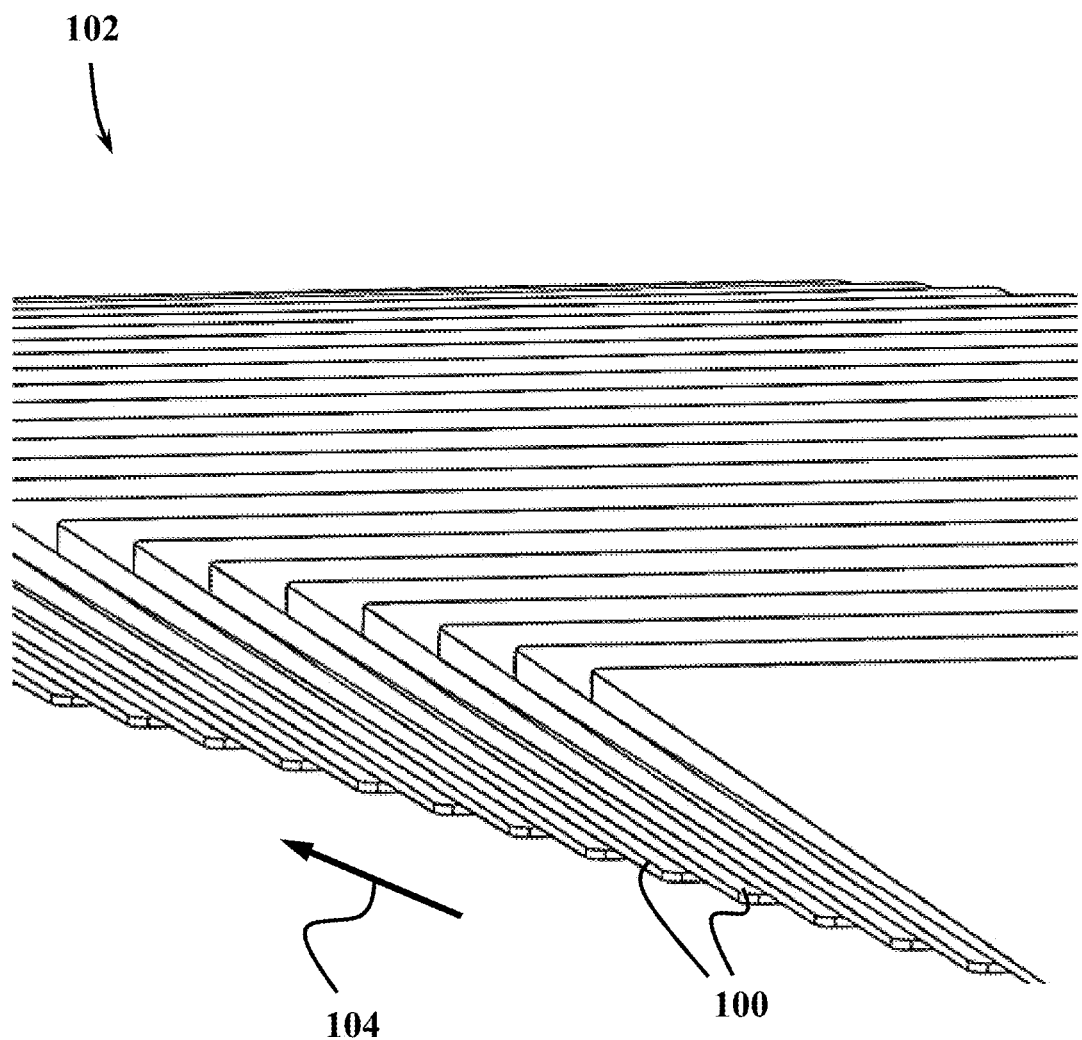
FIG. 1 is a semi-schematic isometric view illustrating an example of a plurality of mutually overlapping items arranged in succession on a conveyor belt.

FIG. 1 is a semi-schematic isometric view illustrating an example of a shingle of items. This shingle of items includes a plurality of mutually overlapping substantially flat items 100 arranged in succession and forming a shingled stream 102 that is carried along a transport path 104. FIG. 1 shows the items 100 being in the form of packages provided in the form of cardboard folded boxes. These items 100 have a non-uniform thickness and a non-symmetrical shape when folded. They are all oriented the same way, such as when they come out from folding and gluing machines.

It should be noted that cardboard is not the only possible material. For instance, the items 100 can be made of a plastic material, a composite material and/or other materials.

Figure 2:
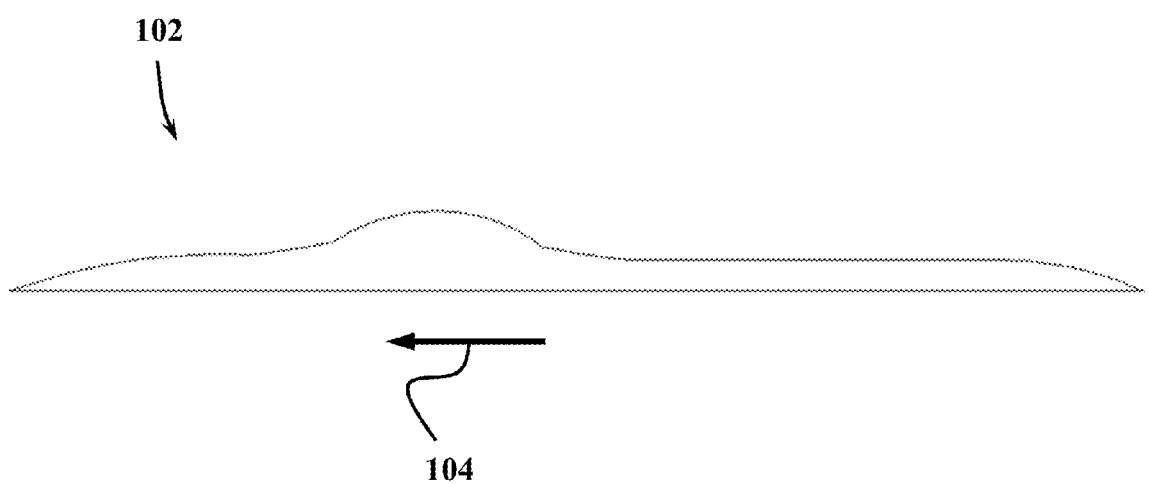
FIG. 2 is a schematic side view depicting an example of a height variation of a supply steam of the items.

The items 100 are prone to slippage relative to one another, especially when carried by a conveyor system that stops and reaccelerates repeatedly. FIG. 2 is a schematic side view depicting an example of a height variation of a supply steam 102 of the items 100, as can be seen in practice. The top line is indicative of the height of the shingled stream 102 along the transport path 104. It shows that the height can be uneven.

Figure 3:
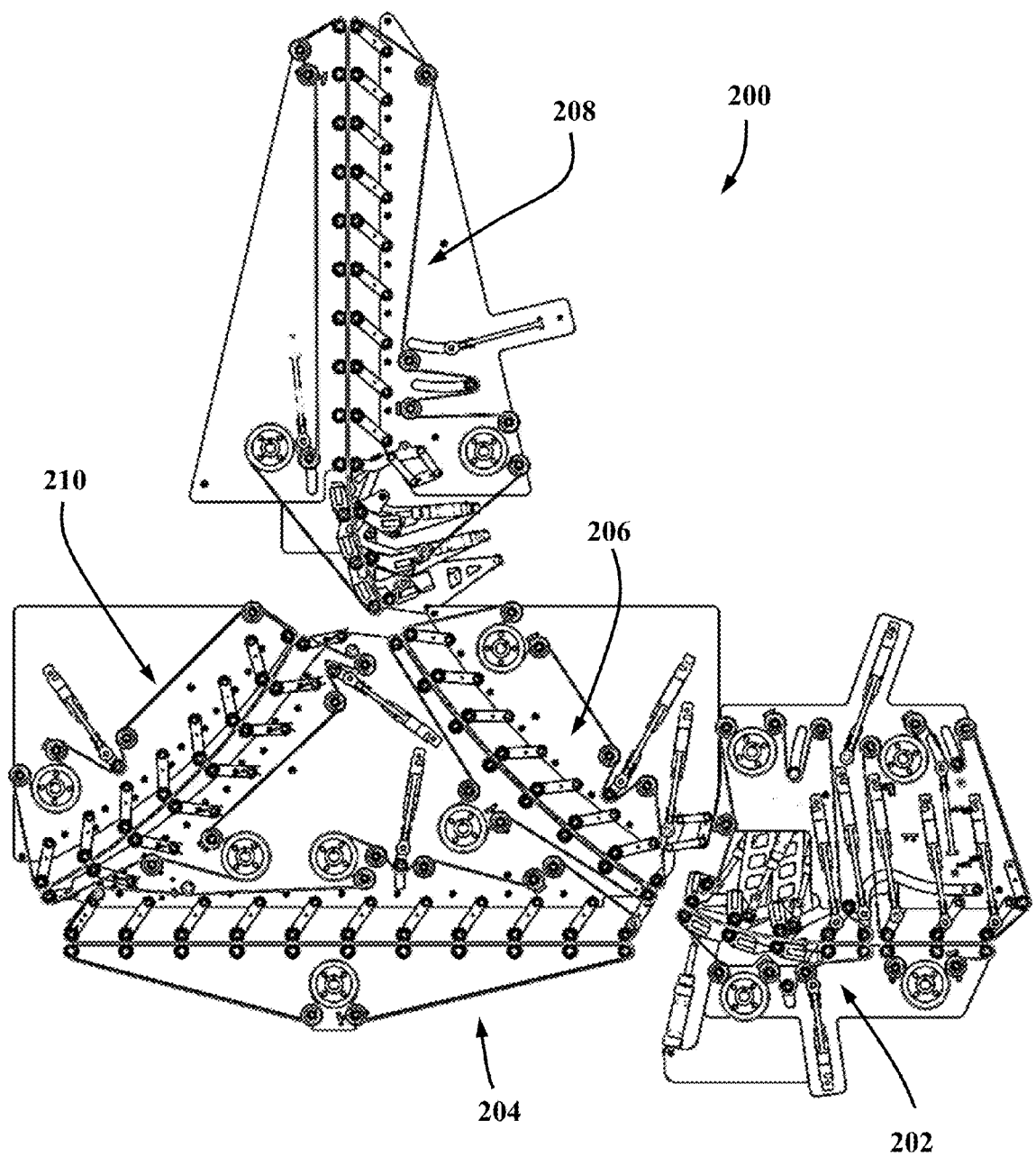
FIG. 3 is a side view of an example of an implementation of a conveyor system incorporating the proposed concept.

FIG. 3 is a side view of an example of a conveyor system 200 incorporating the proposed concept. The conveyor system 200 is designed to carry items such as the items 100 shown in FIG. 1. The conveyor system 200 is shown without any items therein for the sake of illustration. Other examples of conveyor systems can be devised as well. For instance, conveyor systems can be constructed for moving items that have a different orientation than the one shown, such as items where the leading front edges extend vertically or in any non-horizontal manner.

The illustrated conveyor system 200 includes an incoming endless-belt conveyor unit 202 and also a pair of juxtaposed outgoing endless-belt conveyor units 204, 206. Each conveyor unit 204, 206 includes a plurality of parts, such as a frame, at least two juxtaposed endless conveyor belts, a plurality of spaced-apart rollers for supporting the conveyor belt, etc. All these parts are integrated into the conveyor system 200 and can be supported by a framework or by another arrangement.

As explained later with more details, the incoming conveyor unit 202 in FIG. 3 can be set in two different positions. The position illustrated in FIG. 3 corresponds to a position where the incoming conveyor unit 202 is in registry with the top outgoing conveyor unit 206. Items carried by the incoming conveyor unit 202 (moving from the right to the left in FIG. 3 during operation) will follow what is referred to hereafter as the "branching transport path".

The conveyor system 200 in FIG. 3 also includes additional conveyor units, namely conveyor units 208, 210. These additional conveyor units 208, 210, however, are not directly related to the present concept. They are provided as part of the branching transport path for reversing the orientation of the items compared to the ones passing through the other outgoing conveyor unit 204, i.e. following what is referred to hereafter as the "primary transport path". The items passing through both transport paths will merge at a location that is downstream the outgoing conveyor unit 204 and the additional conveyor unit 210. This is only one example of a possible implementation for the proposed concept. Other implementations and uses are possible as well.

The branching transport path is divided in an incoming portion, located inside the incoming conveyor unit 202, and in an outgoing portion, located inside to the top outgoing conveyor unit 206. The primary transport path is divided in an incoming portion, located inside the incoming conveyor unit 202, and in an outgoing portion, located inside the bottom outgoing conveyor unit 204. The primary transport path and the branching transport path thus go through the incoming conveyor unit 202. However, as will be explained, the position of the incoming conveyor unit 202 will not be the same.

Figure 4:
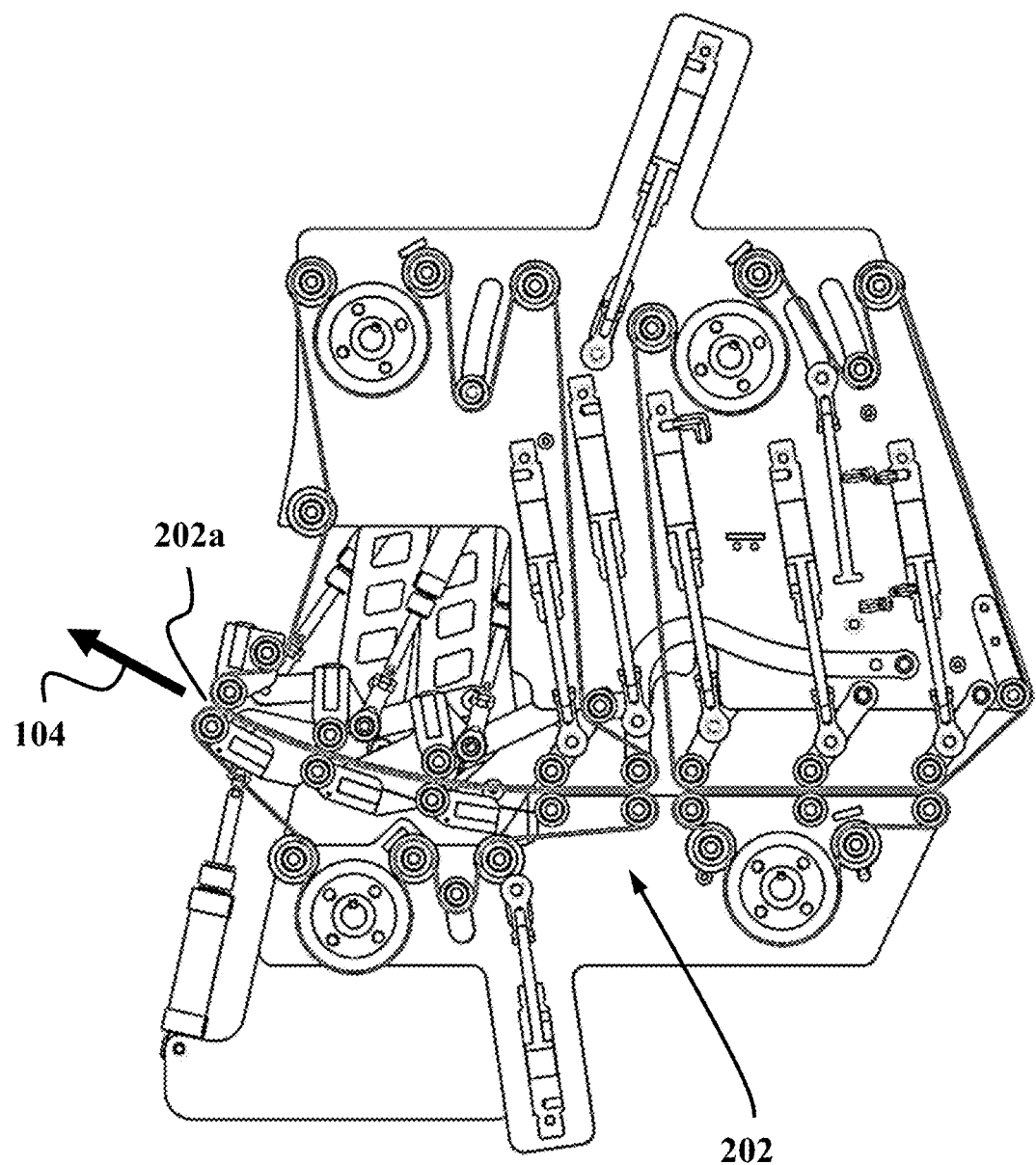
FIG. 4 is an enlarged side view of the incoming conveyor unit of the conveyor system shown in FIG. 3.

FIG. 4 is an enlarged side view of the incoming conveyor unit 202 as shown in FIG. 3. In FIG. 4, the items exit through an outlet end 202a in direction of the arrow. The arrow represents the direction of the transport path 104 at the outlet end 202a when the items follow the branching transport path in the illustrated example.

Figure 5:
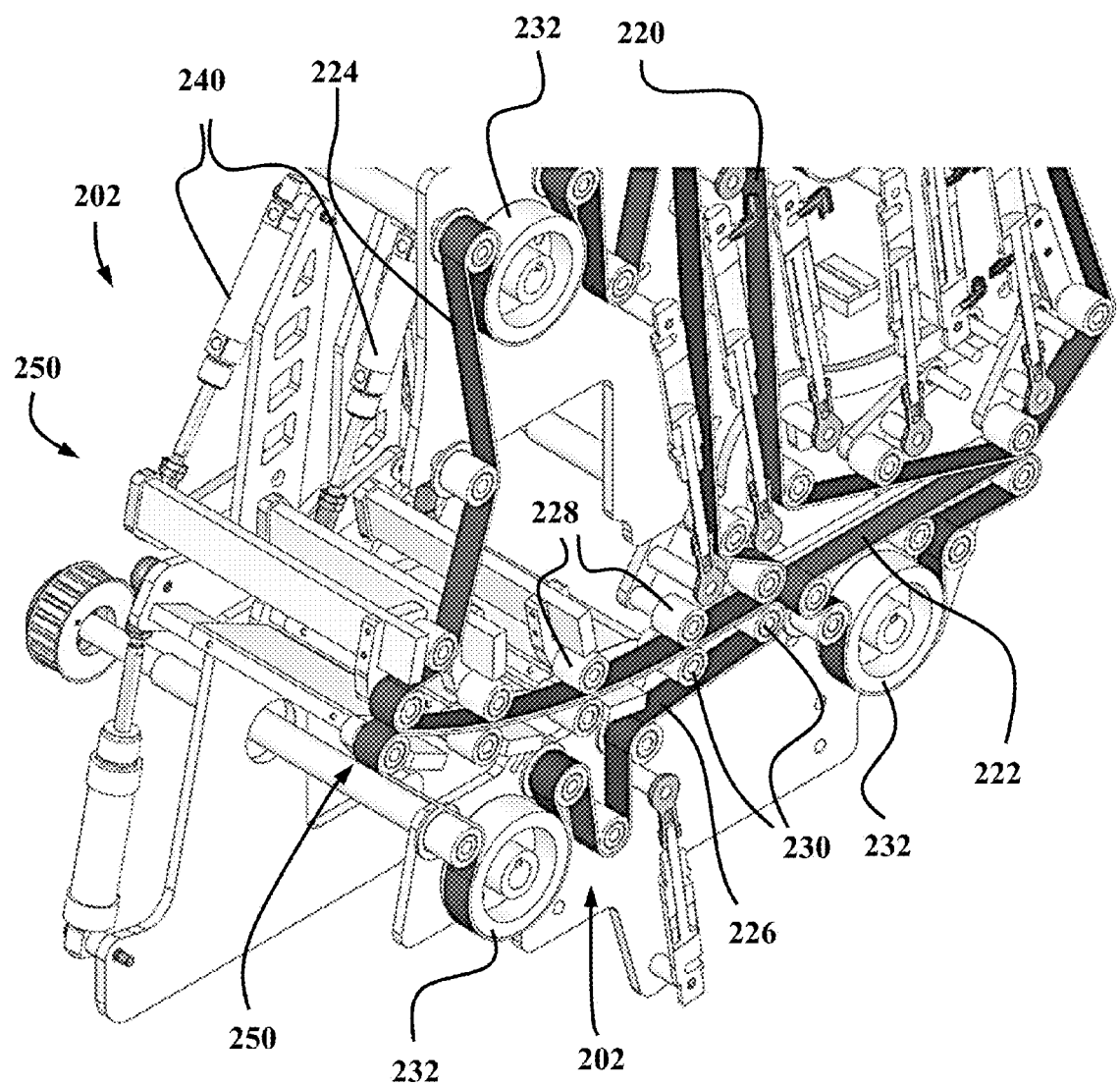
FIG. 5 is an isometric view of the incoming conveyor unit of FIG. 4 but shown in a cross section taken along the medial plane.

FIG. 5 is an isometric view of the incoming conveyor unit 202 of FIG. 4 but shown in a cross section taken along the medial plane. This view reveals many details of this implementation. As can be seen, the incoming conveyor unit 202 includes a plurality of endless conveyor belts 220, 222, 224, 226 that are configured and disposed to create the transport path 104 for the items in that part of the conveyor system 200. The conveyor belts 220, 222, 224, 226 are supported by a plurality of spaced-apart rollers 228, 230, namely top rollers 228 and bottom rollers 230 in the illustrated example. Each roller 228, 230 rotates around a corresponding rotation axis extending transversally with reference to the transport path. Two pairs of juxtaposed conveyor belts 220, 222, 224, 226 are provided in the illustrated example. The first pair is made using the conveyor belt 220 at the top and the conveyor belt 222 at the bottom. The second pair is made using the conveyor belt 224 at the top and the conveyor belt 226 at the bottom. The rollers 228, 230 are adjacent to one another. Variants are possible as well. For instance, it is also possible to design the incoming conveyor unit 202 with more or less pairs of conveyor belts. Many other variants are possible as well.

The conveyor belts 220, 222, 224, 226 and their rollers 228, 230 are located along the medial plane of the incoming conveyor unit 202. The conveyor belts 220, 222, 224, 226 are driven by one or more motors or the like through one or more wheels 232 that are mechanically connected to the driving arrangement. The tangential speed of all conveyor belts 220, 222, 224, 226 is synchronized, although some implementations may be configured otherwise.

In use, the items will be carried throughout the conveyor system 200 while being almost constantly pressed, i.e. frictionally engaged, in-between two corresponding juxtaposed runs of the conveyor belts 220, 222, 224, 226, one at the top and one at the bottom. In the incoming conveyor unit 202, the top conveyor belts 220, 224 are pressed towards the corresponding one of the bottom conveyor belts 222, 226 using a plurality of biasing devices 240, for instance biasing devices with a cylinder having a pressurized gas urging a piston towards an extended position. It is also possible to use other kinds of biasing devices, for instance ones with a mechanical spring or the like. The biasing devices 240 are configured and disposed to constantly maintain a spring force on the top conveyor belts 220, 224. This spring force is transferred to the top conveyor belts 220, 224 by the corresponding ones of the top rollers 228. The forces generated by the biasing devices 240 will hold the items firmly between the runs of conveyor belts 220, 222, 224, 226, thereby mitigating the risks of slippage of the items.

The incoming conveyor unit 202 includes a diverter 250. This diverter 250 is located within a downstream end portion of the second pair of conveyor belts 224, 226. In the illustrated example, it can be set in two different positions, depending on the selected transport path, for instance the primary transport path or the branching transport path. Some implementations can include more than two different positions.

Figure 6:
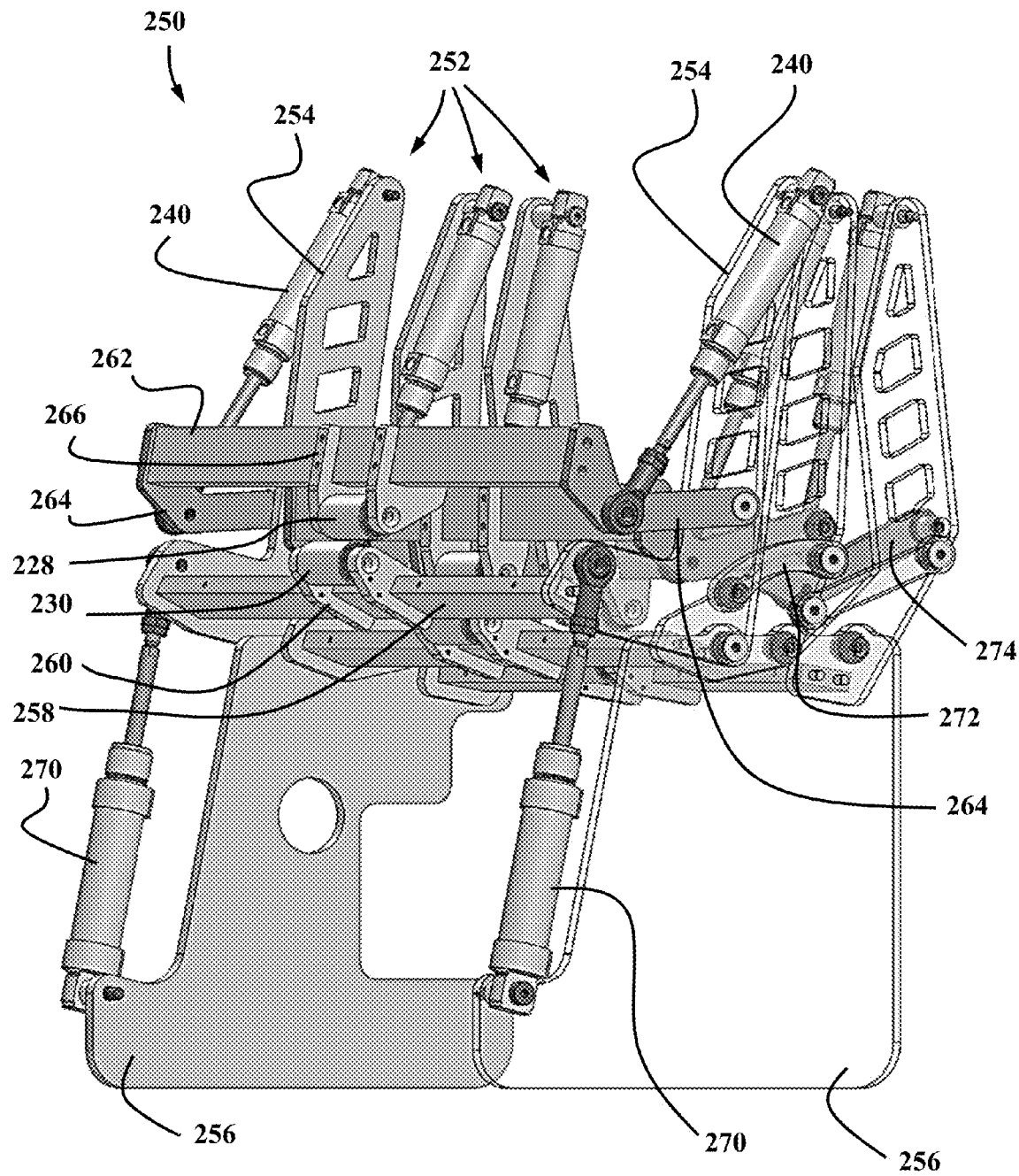
FIG. 6 is an isometric view of the diverter used in the incoming conveyor unit shown in FIG. 3.

FIG. 6 is an isometric view of the diverter 250. It should be noted that some of the parts in FIG. 6 are shown as being semi-transparent only for the sake of illustration.

Figure 7:
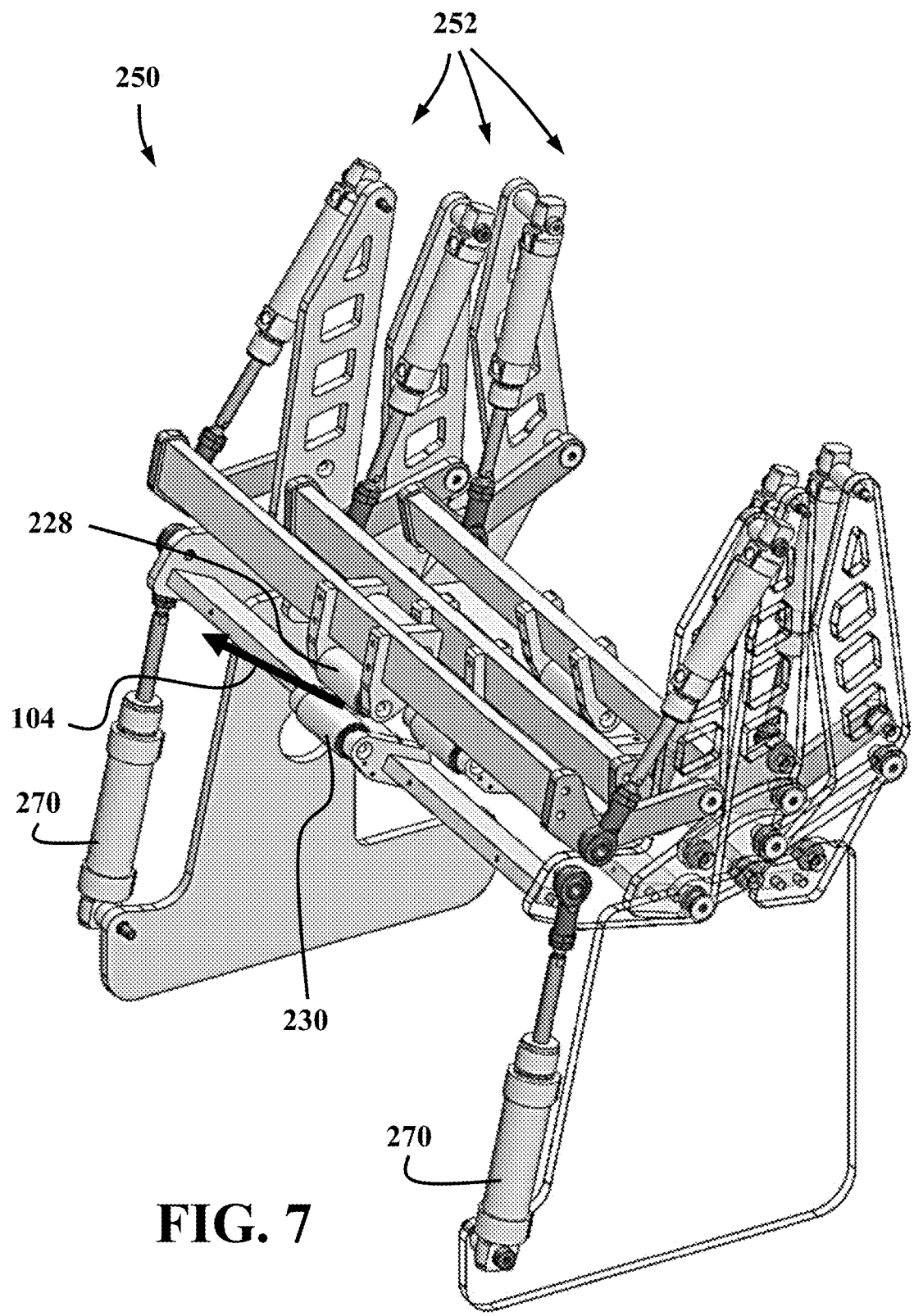
FIG. 7 is a view similar to FIG. 6 but taken from another angle.
Figure 8:
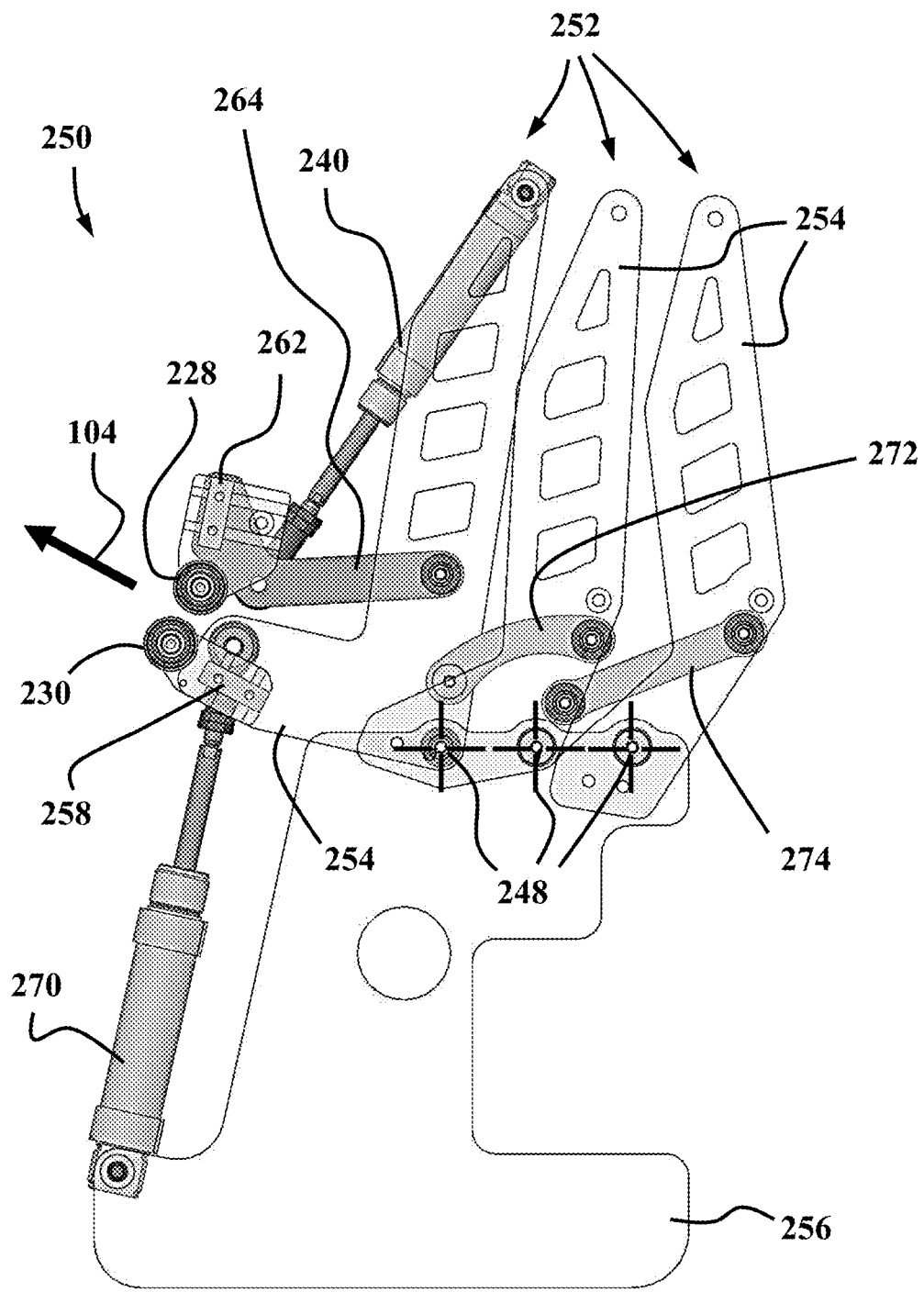
FIG. 8 is a simplified side view of the diverter shown in FIGS. 6 and 7.

FIG. 7 is a view similar to FIG. 6 but taken from another angle. As can be seen, this illustrated diverter 250 has three lengthwise juxtaposed diverter segments 252 extending from side to side across the width of the downstream end portion of the incoming conveyor unit 202. Each of these diverter segments 252 includes a pair of spaced-apart and substantially L-shaped side members 254 extending parallel to the transport path 104. The side members 254 are pivotally mounted near their bottom edge to a corresponding one of opposite frame members 256. The side members 254 pivot around a corresponding pivot axis extending transversally with reference to the transport path 104 and located above the transport path 104. These transversal pivot axes are shown in FIG. 8 at 248. FIG. 8 is a simplified side view of the diverter 250 shown in FIG. 7. Only some of the parts of the diverter 250 are shown.

One side member 254 is located on the exterior side face of the corresponding frame member 256 while the other two side members 254 are on the interior side face. This prevents them from interfering with one another in the illustrated implementation. The diverter 250 can also be configured and disposed differently.

In the illustrated example, the side members 254 of each pair are rigidly connected together by a first (in this case, a bottom) transversal bar 258. The bottom transversal bar 258 supports a first pair of brackets 260 inside which a corresponding bottom roller 230 is mounted. This bottom roller 230 will be the one engaging the underside of the bottom conveyor belt 226. Each segment 252 also includes a second (in this case, a top) transversal bar 262 that is pivotally connected to the corresponding side members 254 using a pair of side arms 264 that are rigidly connected to the top transversal bar 262. Each top transversal bar 262 supports a second pair of brackets 266 inside which a corresponding top roller 228 is mounted. This top roller 228 will be the one engaging the top of the upside conveyor belt 224.

Each segment 252 further includes two of the biasing devices 240. The bottom end of each biasing device 240 is pivotally connected to a corresponding one of the side arms 264 while the top end of each biasing device 240 is pivotally connected to a top location on a corresponding one of the side members 254. The relative position between the two rollers 228, 230 of each diverter segment 252 can change so as to follow the variations in thickness of the shingled stream 102.

It should be noted that in the illustrated example, the diverter 250 carried last three pairs of rollers 228, 230 supporting the top and bottom conveyor belt runs of the top and bottom conveyor belts 224, 226. The downstream end portion of the incoming endless-belt conveyor unit 202 includes additional top and bottom rollers 228, 230 at the upstream end side of these conveyor belts 224, 226. Rollers 228, 230 are also provided to guide the conveyor belts 224, 226 elsewhere in the incoming conveyor unit 202.

Changing the position of the diverter 250 is done using a pair of actuators, for instance a pair of pneumatic actuators 270, each provided on a corresponding side of the incoming conveyor unit 202. The bottom end of each actuator 270 is pivotally connected to the corresponding frame member 256 while the top end of each actuator 270 is pivotally connected to the corresponding side member 254 of the last segment 252. Variants are possible as well.

The side members 254, on each side, are interconnected to one another using two linking arms 272, 274. The side members 254 are thus pivoting together when the actuators 270 are operated. The side members 254 are configured and disposed so that each segment 252 upstream the first one is pivoted as designed. As can be seen, pivoting the last segment 252 will set the segments 252 in different angular positions. One of these positions sets the segments 252 in a non-collinear manner with reference to an immediate adjacent one of the segments 252. Also in the illustrated example, the distance between the rollers 228, 230 and the corresponding pivot axis 248 of each segment 252 is progressively increasing towards the downstream end. Variants are possible as well.

Figure 9:
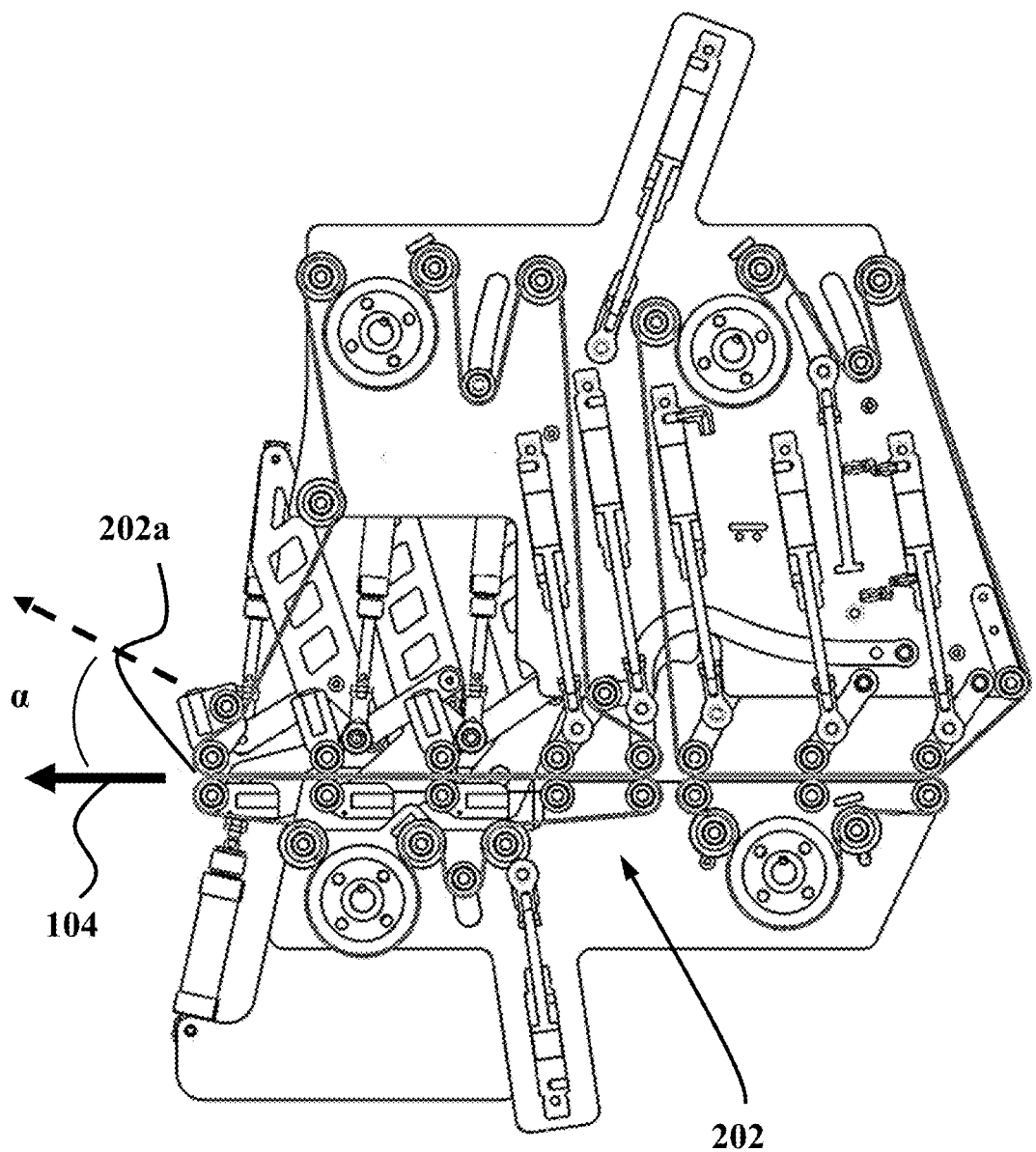
FIG. 9 is a view similar to FIG. 4, showing the downstream end portion of the incoming conveyor unit in a second position.

FIG. 9 is a view similar to FIG. 4, showing the downstream end portion of the incoming conveyor unit 202 when the primary transport path is the selected transport path 104. As can be seen, the items carried along this primary transport path exit through the outlet end 202a in a direction of travel show by the arrow in solid line. For comparison, the arrow in stippled line shows the direction of the branching transport path, which is the one shown in FIGS. 3 to 8. The angle between the two possible transport paths of the illustrated example is defined as angle "α" in FIG. 9. This angle can vary from one implementation to another, depending on various factors.

Figure 10:
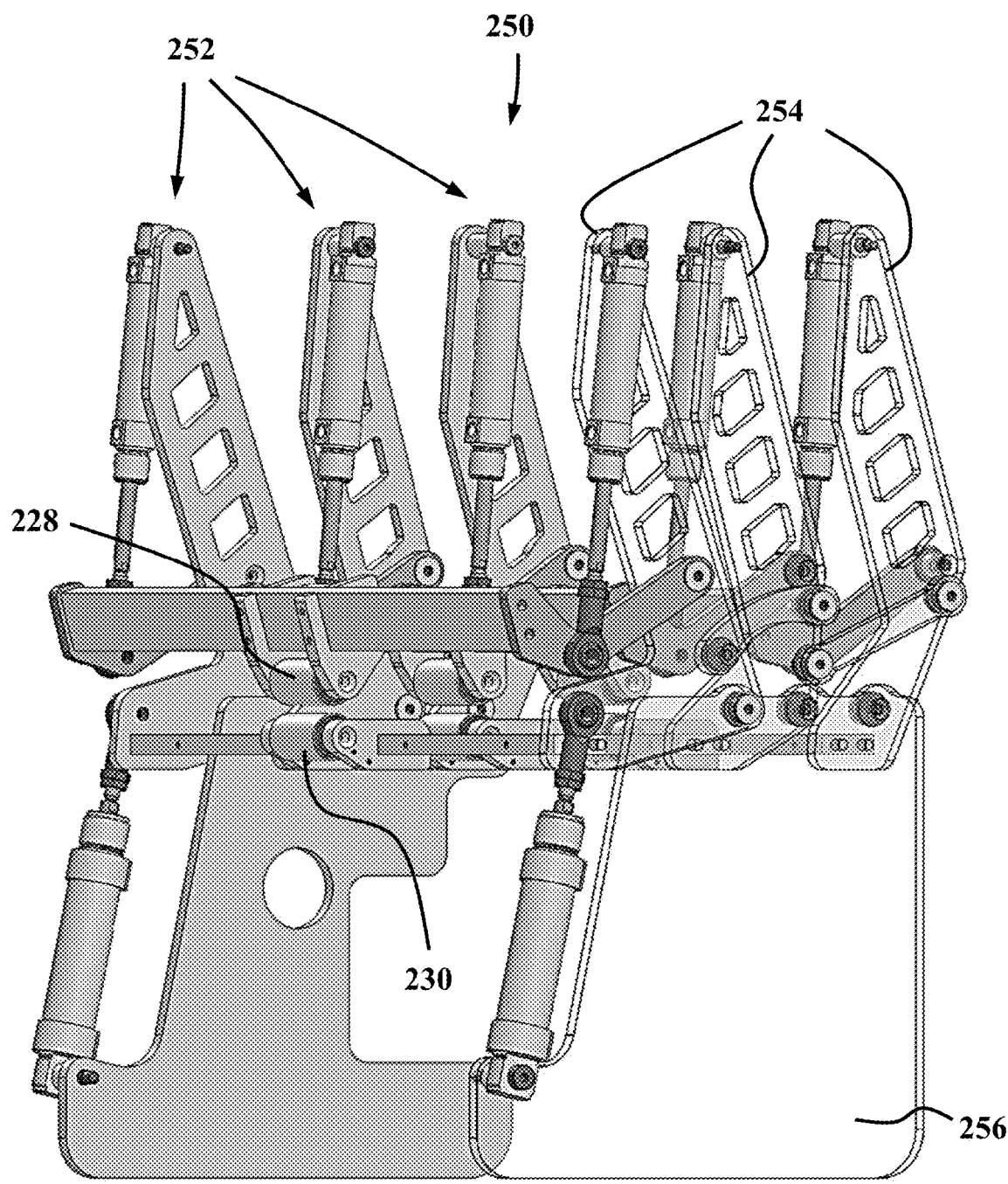
FIG. 10 is a view similar to FIG. 6 but with the diverter being set in the second position.
Figure 11:
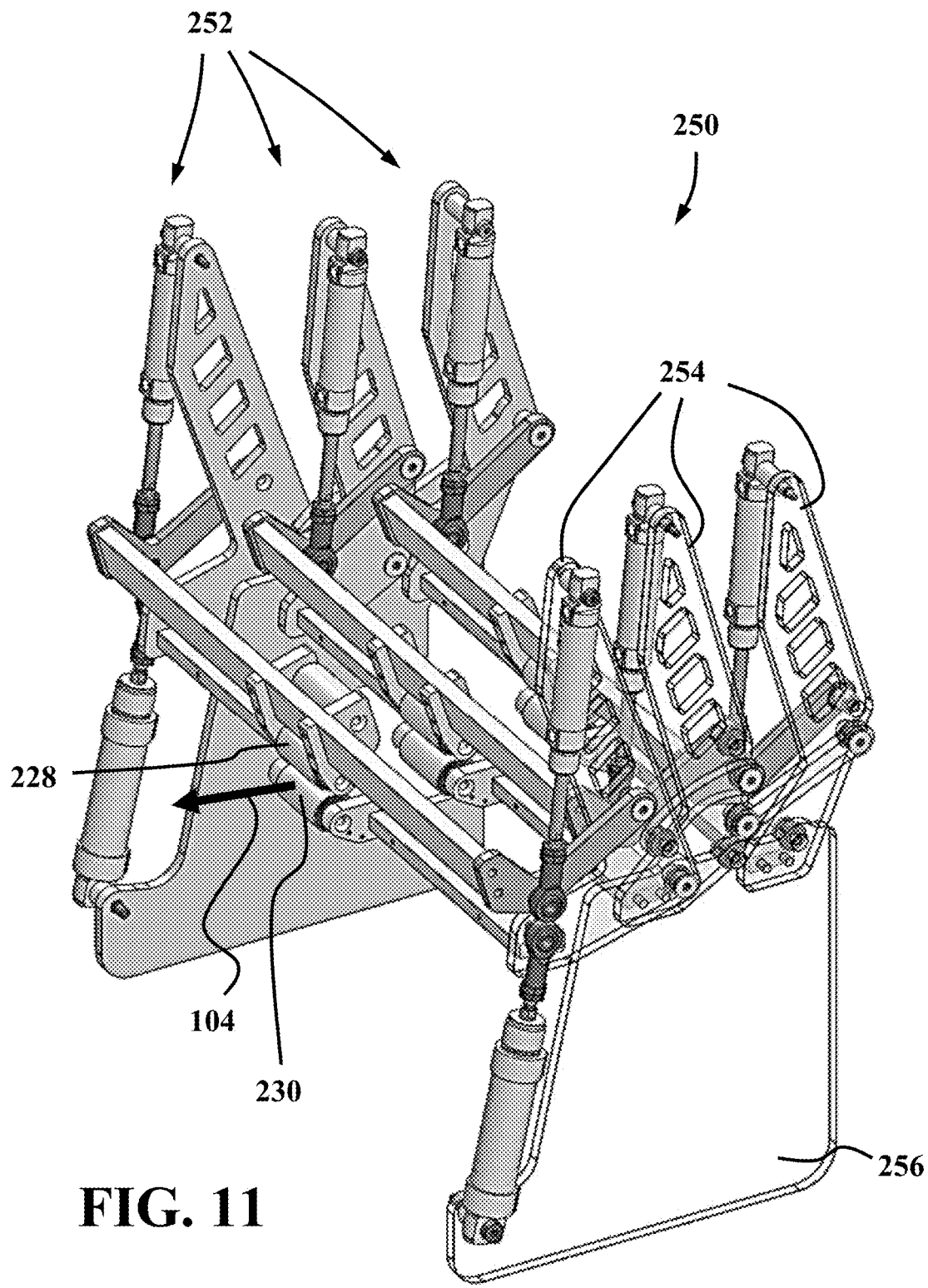
FIG. 11 is a view similar to FIG. 7 but with the diverter being set in the second position.
Figure 12:
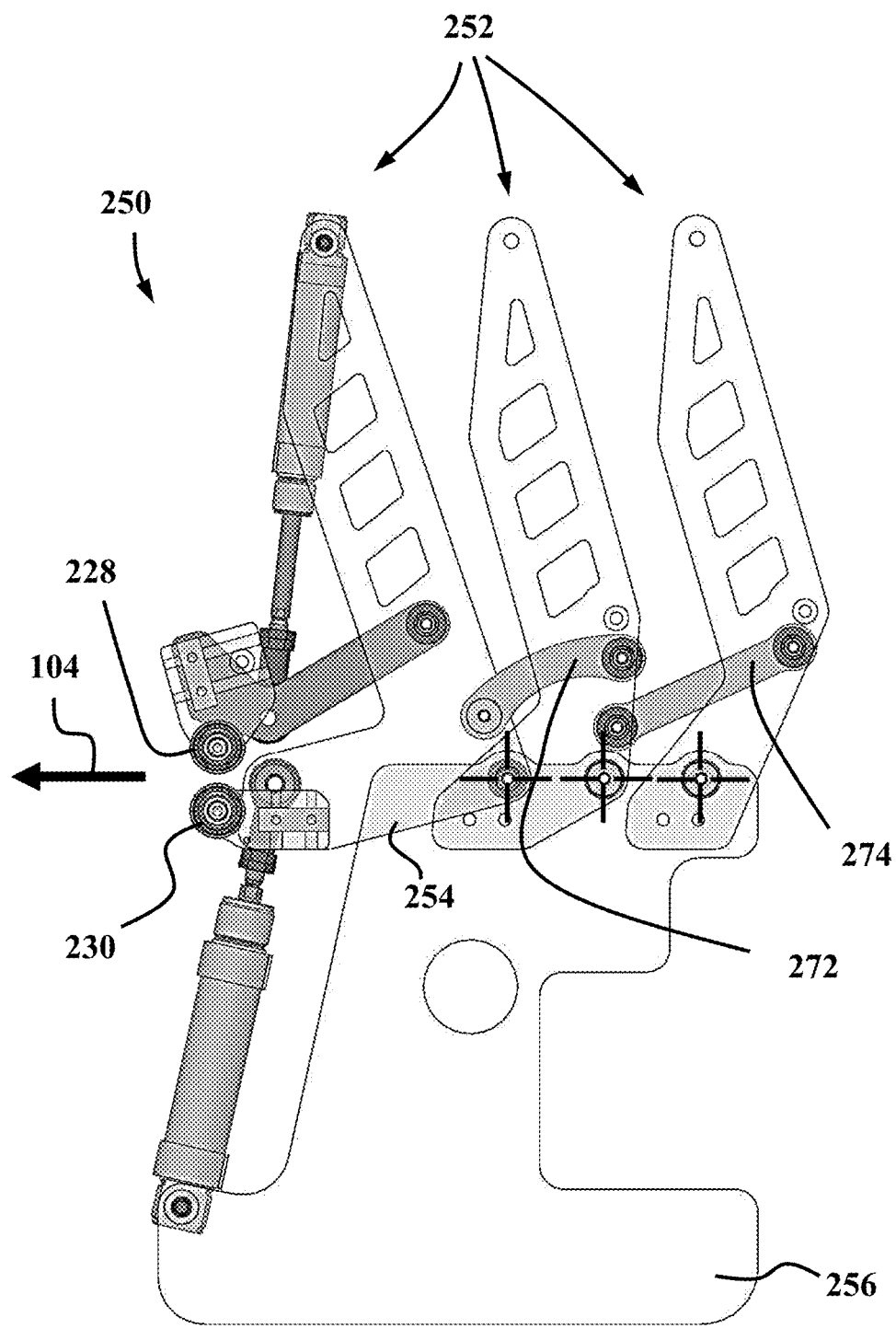
FIG. 12 is a view similar to FIG. 8 but showing the diverter being set in the second position.

FIGS. 10 to 12 are views similar to FIGS. 6 to 8, respectively, but with the diverter 250 being set in the primary transport path.

In use, the transport path 104 within the conveyor system 200 has a curvature in the diverter 250 varying from one position to another. This curvature, however, is prevented in the proposed concept from exceeding the maximum bending angle anywhere along the transport path 104 while still minimizing the overall length of the diverter 250.

To reduce the overall length of the diverter 250 to substantially its minimum value, the proposed concept uses the maximum allowable curvature of the items to be transported in the conveyor system 200. The length of the diverter 250 can be reduced as long as the items do not exceed their maximum bending angle anywhere along the transport path 104 at any one of the possible positions of the diverter 250. Since the branching transport path 104 is the one having the strongest curvature in the diverter 250 of the illustrated example, the branching transport path will requires an increased attention.

Figure 13:
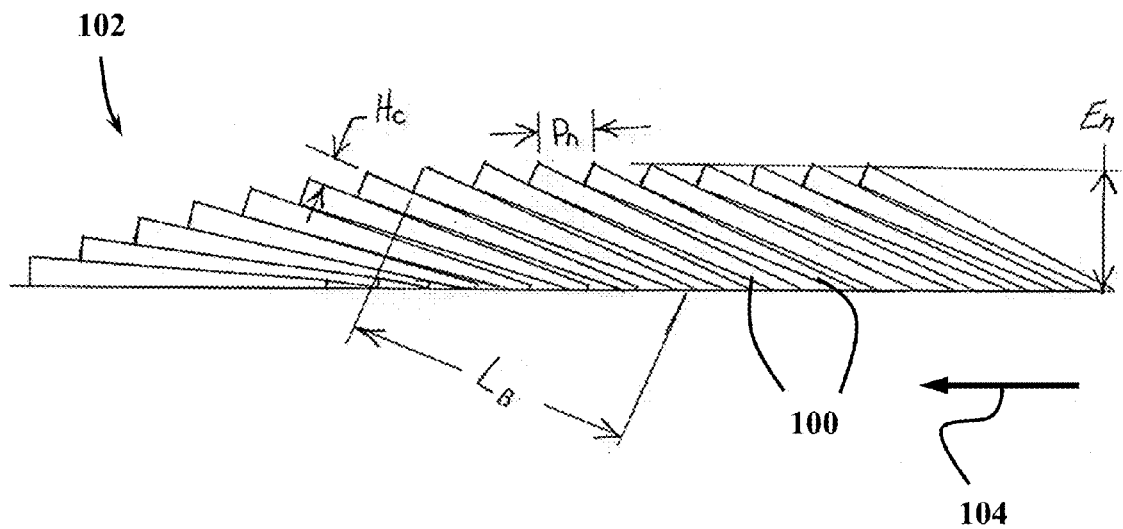
FIG. 13 is a schematic side view of some of the items of FIG. 1.

One challenge in dealing with mutually overlapping substantially flat items is that some characteristics of the shingle of items vary all the time. FIG. 13 is a schematic side view of some of the items 100 of FIG. 1. This figure shows some of the parameters characterizing the shingled stream 102 of items 100. "$E_n$" refers to the thickness of the shingled stream 102, "$H_c$" refers to the maximum thickness of the items 100, and "$P_n$" refers to the spacing between two successive ones of the items 100. Although some or even all parameters vary continuously, the approach based on the proposed concept involves using a virtual model of the shingled stream 102 to calculate an optimize curvature for the items 100 to be fed in the diverter 250. This virtual model will then be used to design the diverter 250.

Figure 14:
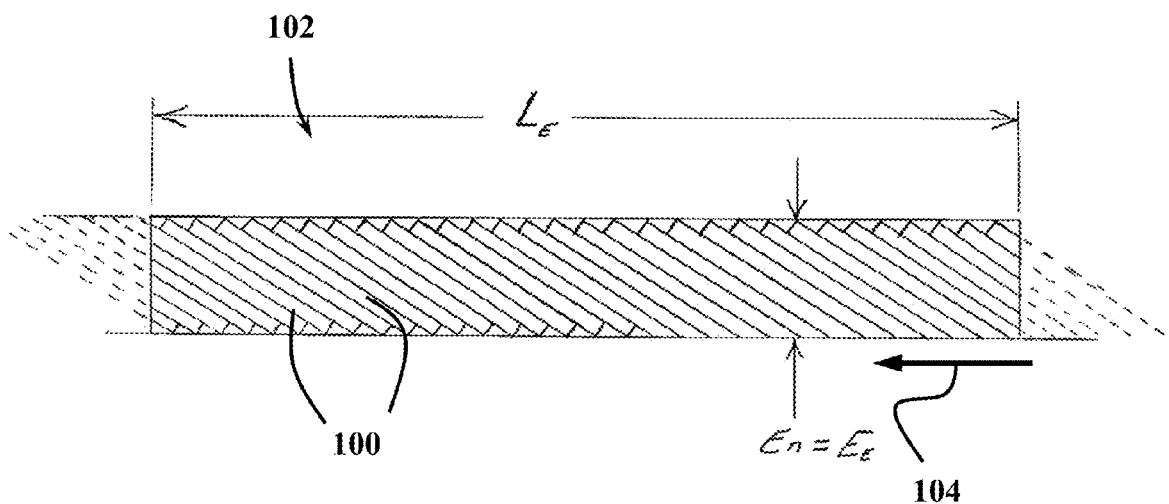
FIG. 14 is a schematic side view illustrating the monolithic element for modeling the shingled stream of items.

It was found that the behavior of a shingled stream 102 can be modeled as a monolithic element 300 having a given length "$L_E$" and a thickness "$E_E$", as shown in FIG. 14. In this model, the thickness "$E_E$" is the thickness $E_n$ of the shingled stream 102. The monolithic element 300 has a rectangular cross section in the illustrated example. Although some parameters still change all the time, the approximation given by the virtual model yields a result that takes into account other parameters and facts that can be known in advance. First, the shingled stream 102 is more rigid when the thickness is increased. The maximum thickness of the shingled stream 102 is thus a factor to consider. Another factor is the height of the "obstacle" to overcome when the diverter 250 changes from one position to another.

Figure 15:
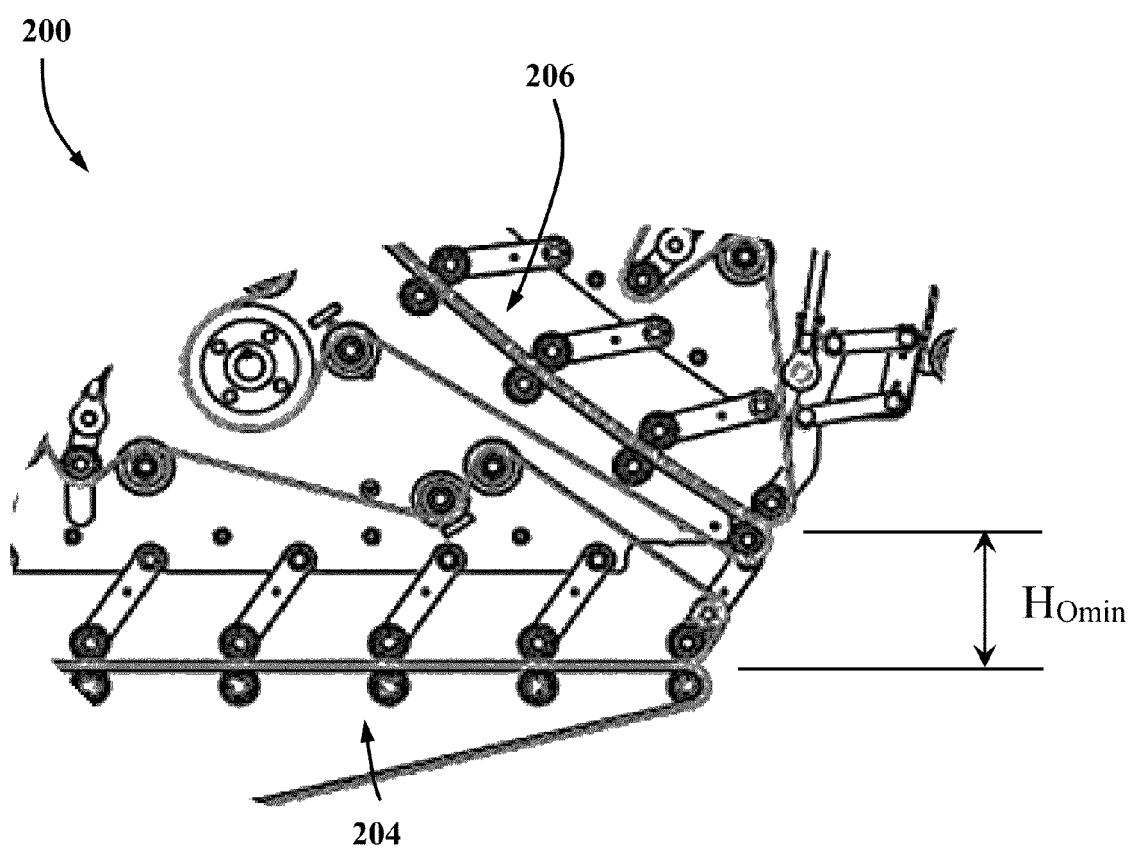
FIG. 15 is an enlarged view of the two outgoing conveyor units illustrated in FIG. 4 to show the vertical height difference between them.

FIG. 15 is an enlarged view of the two outgoing conveyor units 204, 206 of the illustrated conveyor system 200. It shows that the vertical height of the obstacle is the height difference between the two outgoing conveyor units 204, 206 at their upstream end. This vertical height difference is expressed as "$H_{Omin}$". It refers to the minimum height difference and it essentially depends on factors such as the maximum thickness of the shingled stream 102 entering one of the outgoing conveyor units 204, 206, the diameter of the first roller of the top conveyor belt at the upstream end of the bottom outgoing conveyor unit 204, and the diameter of the first roller of the bottom conveyor belt at the upstream end of the top outgoing conveyor unit 206. Reducing the height difference can reduce the overall length of the diverter 250 of the incoming conveyor unit 202. However, the height difference cannot be eliminated.

Figure 16:
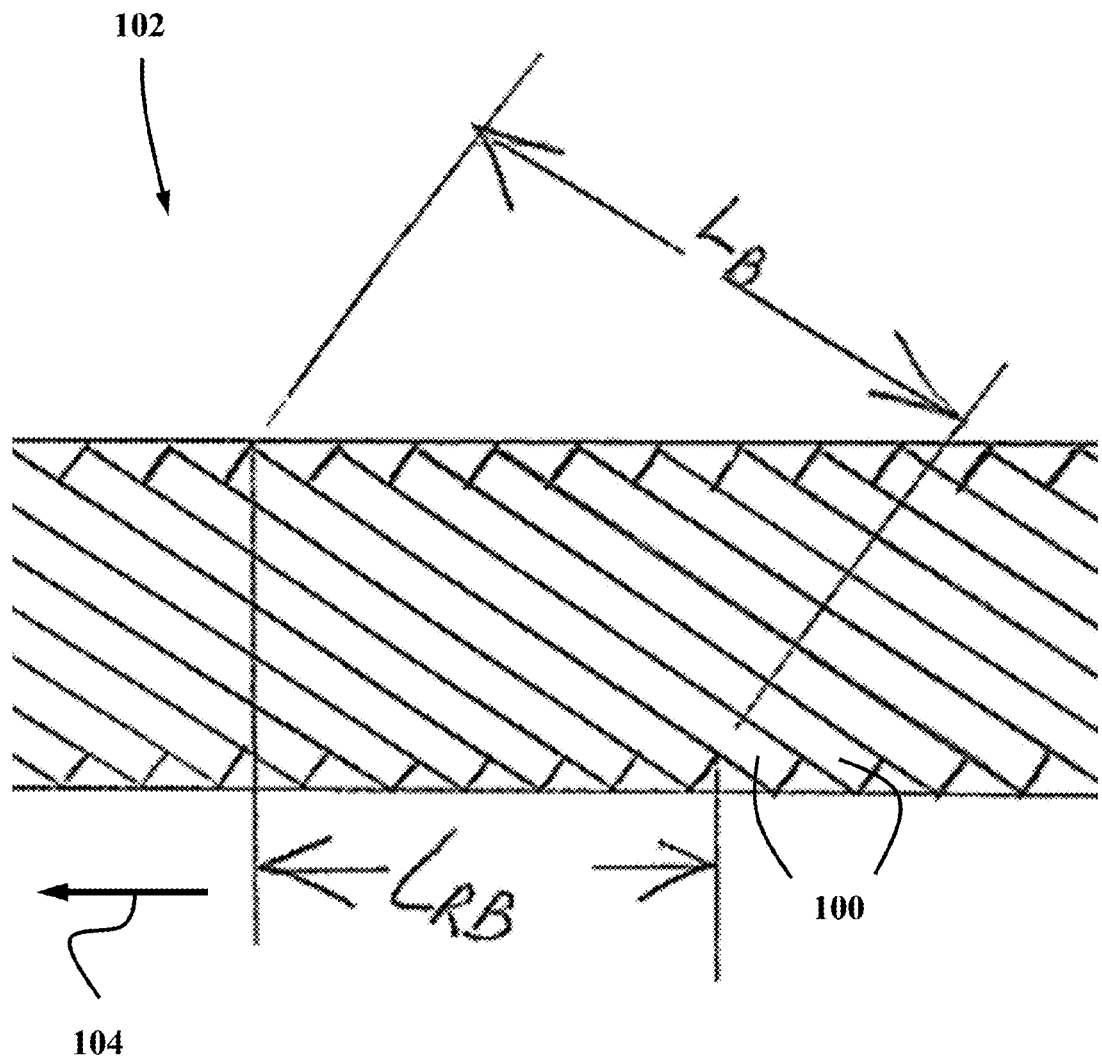
FIG. 16 is an enlarged side view of some of the items in the shingled stream shown in FIG. 14.

FIG. 16 is an enlarged side view of some of the items 100 in the shingled stream 102 shown in FIG. 14. In order to further refine the model, the monolithic element 300 is assumed to have a length that is approximately equal to the length of an individual item 100. If each item 100 has a length "$L_B$", then this length can be projected along the transport path 104 as the length "$L_{RB}$".

Figure 17:
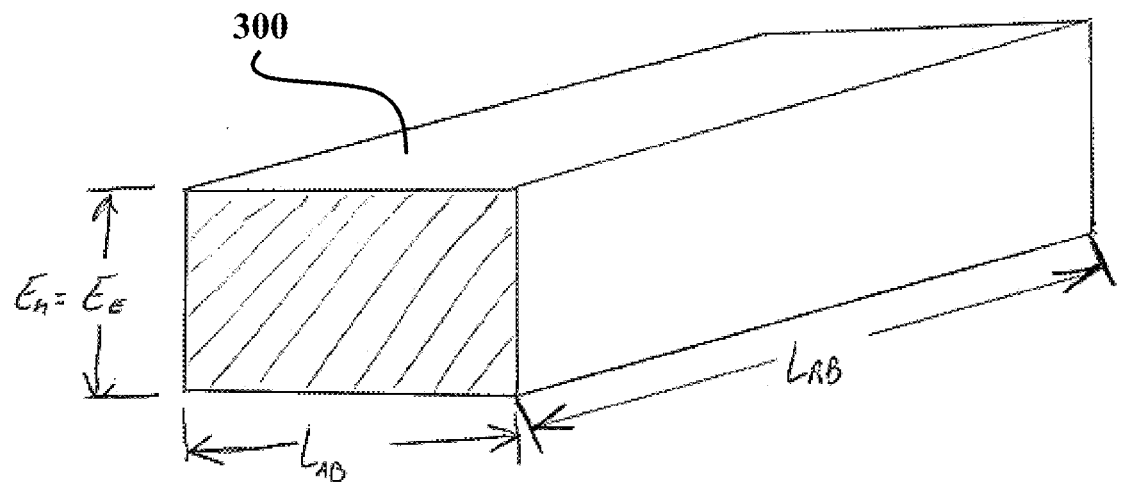
FIG. 17 is a schematic isometric view of an example of a monolithic element for modeling the shingled stream of items.

FIG. 17 is a schematic isometric view of an example of a monolithic element 300 for modeling the shingled stream 102. The monolithic element 300 has a length $L_{RB}$, a thickness $E_E$, and a width "$L_{AB}$", which width is the width of the items 100. The material properties of the monolithic element 300, for instance the rigidity, are assumed to be homogeneous everywhere in the monolithic element 300.

Figure 18:
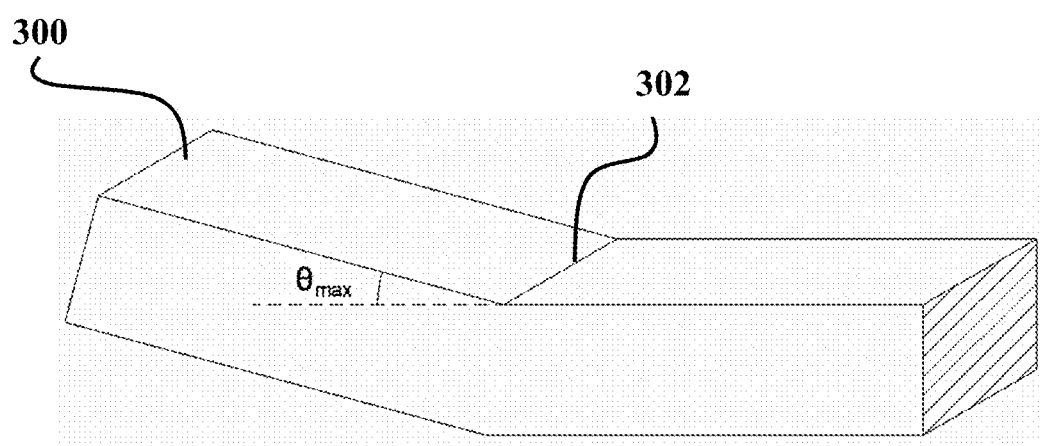
FIG. 18 is a view similar to FIG. 17, illustrating the maximum bending angle of the monolithic element.

FIG. 18 is a view similar to FIG. 17, illustrating the maximum bending angle of the monolithic element 300. The monolithic element 300 has a maximum bending angle of "$\theta_{max}$" above which a plastic deformation occurs. This plastic deformation will result, for example, in a crease 302 extending across the width of the monolithic element 300.

The maximum bending angle of an item depends on various factors, such as:
  The properties of the item, for instance:
    the length of the item;
    the width of the item;
    the variation of the shape of the item along its length;
    the spring-effect of some portions of the items due to the shaping and gluing.
  The material used, for instance:
    for folding carton, whether the cardboard is made with new fibers or recycled fibers;
    for corrugated cardboard: the orientation of the corrugations;
    for plastic, whether the plastic is transparent, semi-transparent or opaque;
    the type of paper;
    the thickness of the item.
  The surface finish of the item, for instance:
    the kind of lacquer;
    the kind of ink;
    the kind of material.
  The glue used to assemble the item.
  The orientation of the fibers, for instance:
    lengthwise oriented;
    crosswise-oriented;
    diagonal;
    random.

It is always a challenge to calculate the maximum bending angle using only a mathematical model. This angle can rather be measured using actual samples. The maximum bending angle is usually less for corrugated cardboard than folding carton. Increasing the thickness of the material also decreases the maximum bending angle.

The approach followed using the present concept is to determine if the diverter 250 should be segmented or not along its length. Segmenting the diverter 250 means dividing the length of the diverter 250 into one or more lengthwise juxtaposed segments N, where N≥1 and is an integer. Each segment is in fact a length of the transport path 104 between two successive rollers supporting the corresponding conveyor belts. Under the proposed approach, each segment is designed so that the local deflection angle $\theta_i$ is not exceeding the maximum bending angle $\theta_{max}$. Still, in some implementations, using only one segment may be enough (N=1). Thus, having only one segment remains a possibility.

Figure 19:
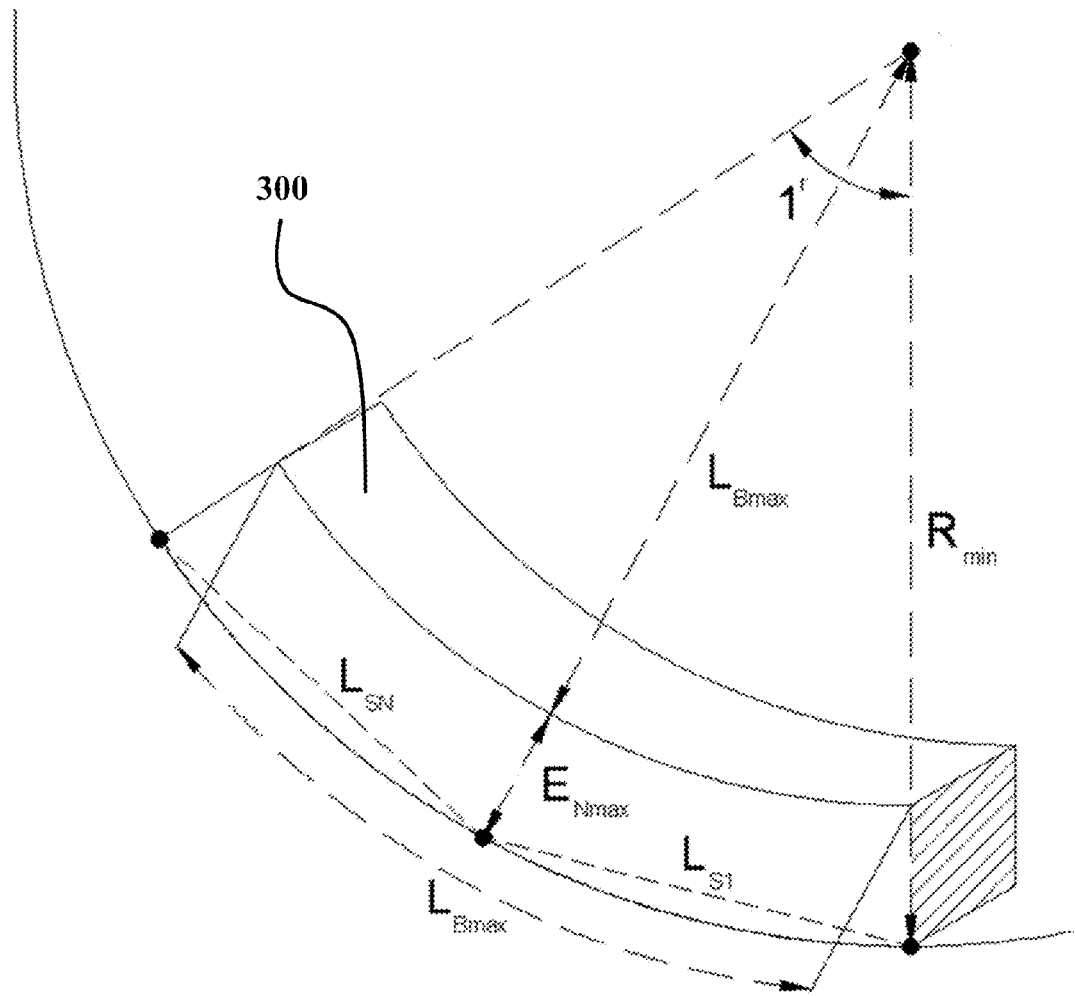
FIG. 19 is a schematic isometric view of an example of a monolithic element being divided in two segments to show how this changes the calculations.

FIG. 19 is a schematic isometric view of an example of a curved monolithic element 300 being divided in two segments to show how this can change the design. The monolithic element 300 is shaped like as it would be forced to follow a curved portion of a transport path. It shows that the curved portion has a radius $R_{min}$. This is used to calculate the length of the segments for a given maximum bending angle $\theta_{max}$. One can assume that, for an item made of folding carton for instance, $R_{min}$ is $L_{Bmax}+E_{Nmax}$, ($L_{Bmax}$ being the maximum length of the item and $E_{Nmax}$ being the maximum thickness of the shingled stream 102) so that any item 100 always fits into an arc of 1 radian or less. Each segment must be at $R_{min}$ or above and $\theta_{max}$ must not be exceeded to avoid a plastic deformation.

In practice, $R_{min}$ can be measured on actual samples. $\theta_{max}$ is then more limitative since the segments cannot be smaller than the smallest possible length $L_{Smin1}$ that it is physically possible to have.

Figure 20:
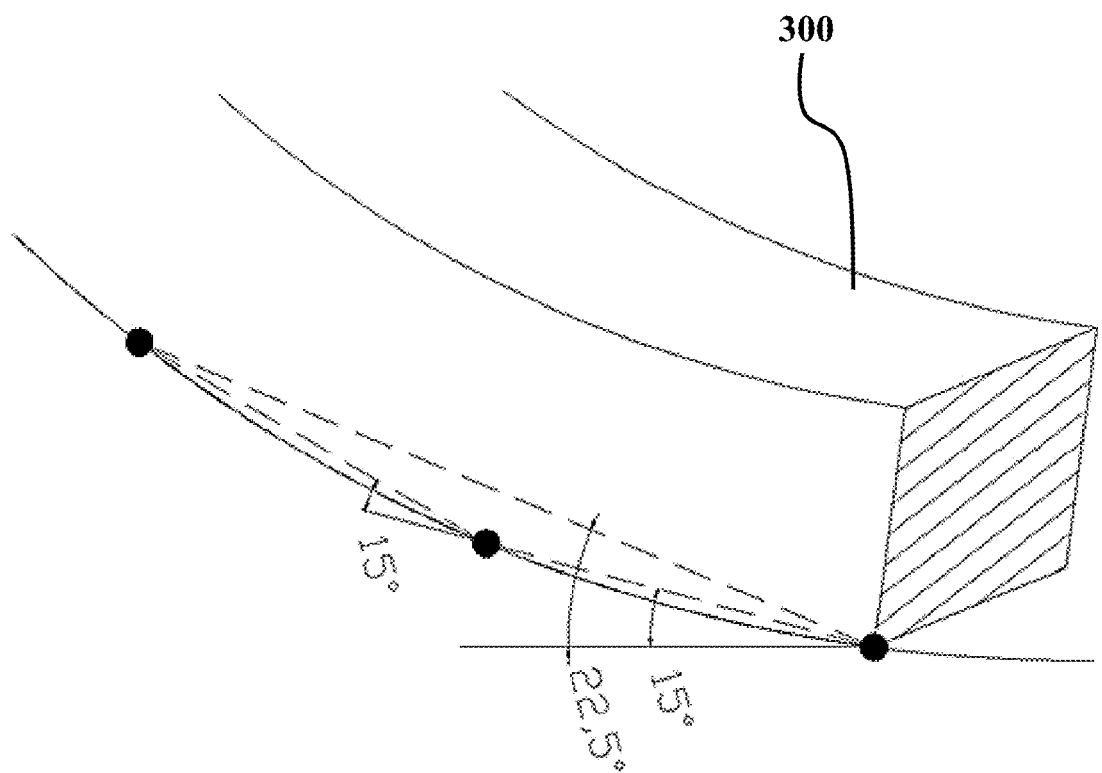
FIG. 20 is an enlarged schematic isometric view of an example of a curved monolithic element with a one-segment scenario and a two-segment scenario.

FIG. 20 is an enlarged schematic isometric view of an example of a curved monolithic element 300 with a one-segment scenario and a two-segment scenario where the maximum bending angle is 15 deg. The radius of curvature is the same in both scenarios but in the one-segment scenario, the bending angle reaches of 22.5 deg. while it is at 15 deg. for the two-segment scenario. Thus, a plastic deformation will occur in the one-segment scenario is used but not for the two-segment scenario. The bending angle is measured by comparing the line extending between two consecutive segment points with the tangent at the point downstream the other. The two-segment scenario is also the one that will lead to the smallest overall length since the bending angle is at the maximum without exceeding it.

Figure 21:
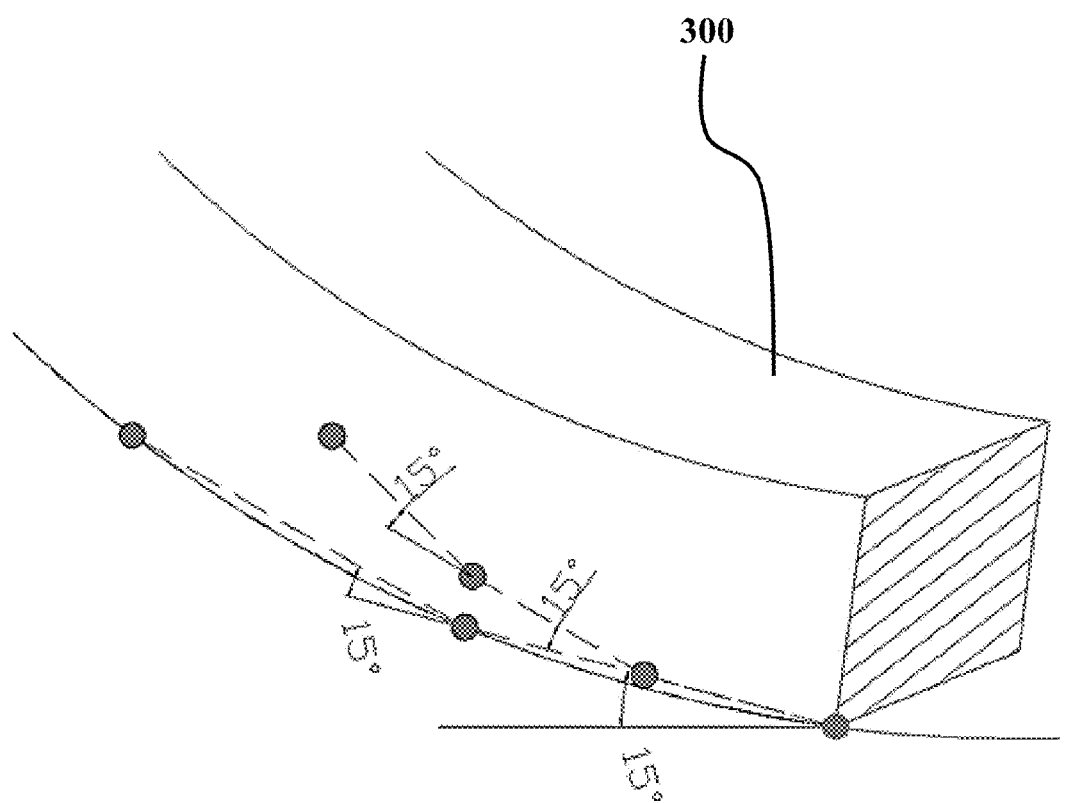
FIG. 21 is a view similar to FIG. 20, showing another example of a curved monolithic element with a scenario where one set of segments has a smaller average length than that of the other.

FIG. 21 is a view similar to FIG. 20, showing another example of a curved monolithic element 300 with a scenario where one set of segments has a smaller average length than that of the other. In this example, the curvature was calculated to be at a maximum bending angle of 15 deg. It clearly shows that using a smaller average length of the segments yields better results, meaning that the curvature can be greater. Thus, this will result in a smaller overall length of the diverter 250. The length is calculated with reference to the transport path.

When designing the diverter 250, the parameters $H_{Omin}$ and $L_{Smin}$ are first determined. $H_{Omin}$ is the height of the obstacle and $L_{Smin}$ is the minimum length of the segments. The segments should not be smaller than one can physically construct. Also, using smaller segments will increase their overall number. Ideally, the number of segments should be kept as small as possible for the sake of simplicity and also to minimize the overall length $D_A$ of the diverter 250 as well as costs.

Generally, an item having a relatively high value of $\theta_{max}$ (e.g. 30 deg.) will need a smaller number of segments (e.g. N=1) while an item having a relatively low value of $\theta_{max}$ (e.g. 5 deg.) will need a greater number of segments so as to minimize the length of the diverter 250.

Figure 22:
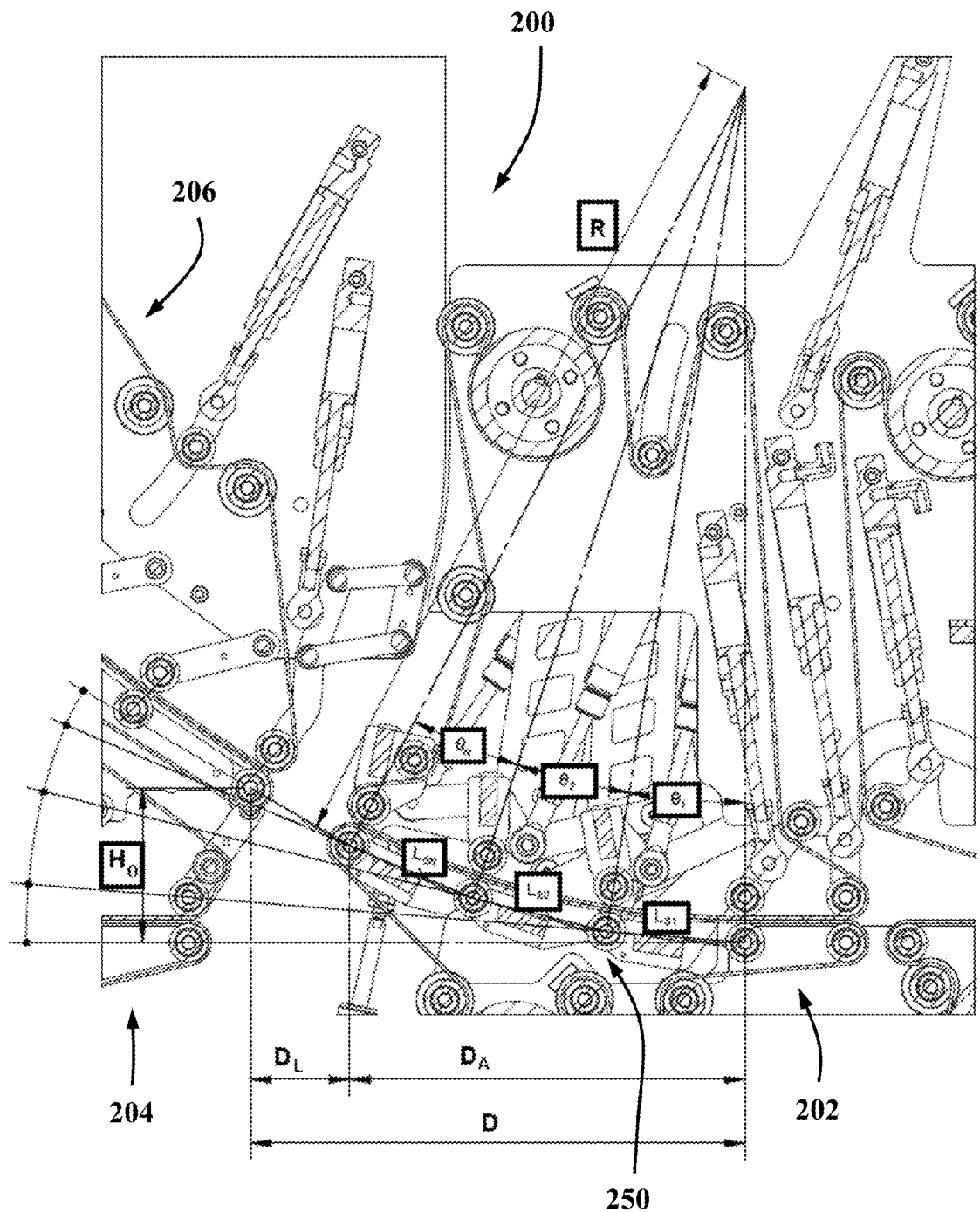
FIG. 22 is a side view illustrating the dimensions as applied to the implementation shown in FIG. 3.

FIG. 22 is a side view illustrating the dimensions as applied to the implementation shown in FIG. 3.

$D_L$ is the available clearance between the incoming conveyor unit 202 and the outgoing conveyor unit 206 where the curvature will be the greatest. This clearance should be as small as possible for a maximum control because no conveyor belt is present in the intervening space. A minimum clearance is kept to prevent parts from interfering with one another. Generally, $D_L$ should be less than half the length of the smallest item to transport so as to mitigate the risks of slippage.

The various parameters used in the design of the diverter 250 are as follows:
  N: Number of segments;
  $H_O$: Vertical height of the obstacle;
  $H_{Omin}$: Minimal height of the obstacle;
  R: Radius;
  $L_{Si}$: Length of each segment i;
  $\theta_i$: Angle between successive segments;
  $D_A$: Length of the diverter with reference to the horizontal;

$D_L$: Horizontal clearance between the incoming conveyor unit and the outgoing conveyor units;

D: Sum of $D_A+D_L$;

$\theta_{max}$: Maximum bending angle;

$L_{Bmax}$, $L_{Bmin}$: Maximum and minimum length of the items to be carried;

$L_{Smin1}$: Minimum length that a segment can physically have;

$L_{SN}$: Length of the last segment;

$E_{Nmax}$: Maximum thickness of the shingled stream.

Figure 23:
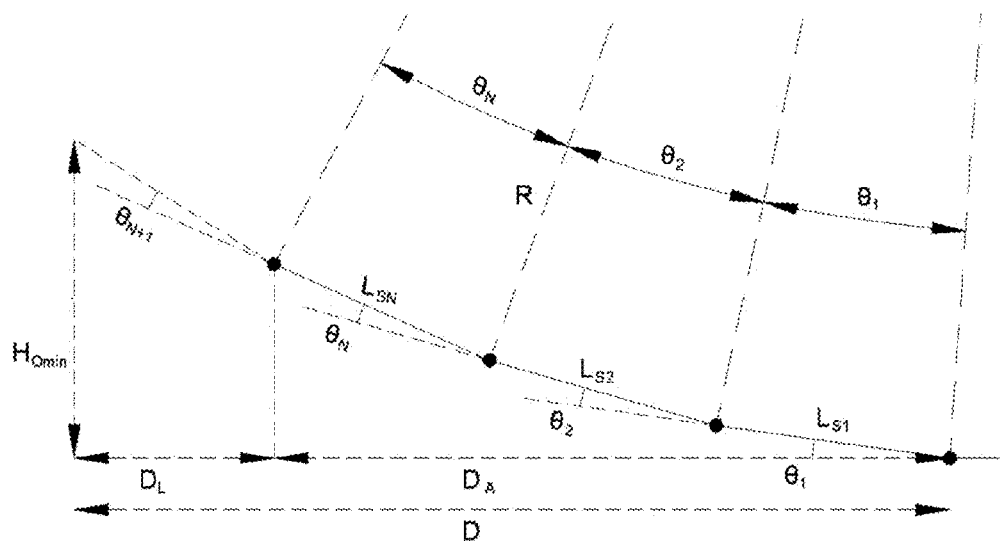
FIG. 23 is a schematic view illustrating an example of the design of a diverter.
Figure 24:
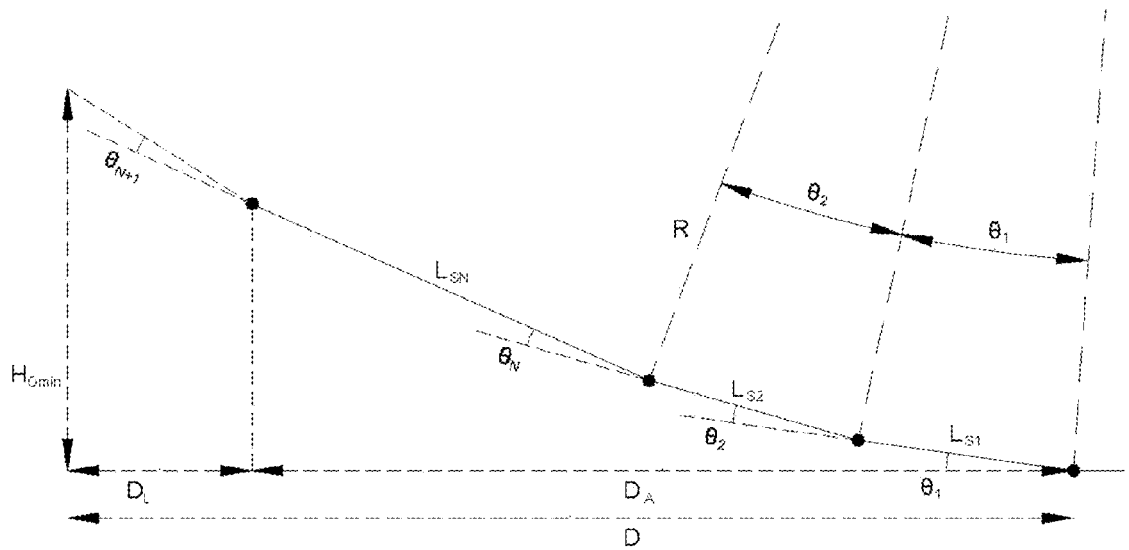
FIG. 24 is a view similar to FIG. 23 but showing another design example.

To simplify the mechanical design, one can provide an equal length $L_S$. This is shown in FIG. 23. FIG. 24 is a schematic view illustrating an example of the design of a diverter 250.

The following equations are then used to determine the various parameters in accordance with the number of segments having identical lengths:

$$\theta_{1 \to N} = \theta_{max}$$

$$H_O = H_{Omin}$$

$$L_{Smin2} = 2 \cdot (L_{Bmax} + E_{Nmax}) \cdot \sin\left(\frac{\theta_{max}}{2}\right)$$

$$L_{Smin} = \text{Maximum}(L_{Smin1}, L_{Smin2})$$

$$L_{Si} = \frac{(H_O - D_L \cdot \tan[(N+1) \cdot \theta_{max}])}{\sum_{i=1}^{N} \sin(i \cdot \theta_{max})} \geq L_{Smin}$$

$$D = L_{Si} \cdot \sum_{i=1}^{N} \cos(i \cdot \theta_{max}) + D_L$$

FIG. 24 is a schematic view illustrating another example of the design of a diverter 250. It represents an optimized solution for reducing $D_A$ by providing the (N−1) first segments with their length being equal to $L_{Smin}$ and an angle between them of $\theta_{max}$. The last segment $L_{SN}$ is made with an angle $\theta_{max}$ and its length sufficient to overcome the obstacle $H_{Omin}$.

The following equations are then used to determine the various parameters in accordance with the number of segments having a variable length:

$$\theta_{1 \to N} = \theta_{max}$$

$$H_O = H_{Omin}$$

$$L_{Smin2} = 2 \cdot (L_{Bmax} + E_{Nmax}) \cdot \sin\left(\frac{\theta_{max}}{2}\right)$$

$$L_{Smin} = \text{Maximum}(L_{Smin1}, L_{Smin2})$$

$$L_{S1 \to (N-1)} = L_{Smin}$$

$$L_{SN} = \frac{\left(H_O - L_{Smin} \cdot \sum_{i=1}^{N-1} \sin(i \cdot \theta_{max}) - D_L \cdot \tan((N+1) \cdot \theta_{max})\right)}{\sin(N \cdot \theta_{max})}$$

$$\geq L_{Smin}$$

$$D = L_{Smin} \cdot \left[\sum_{i=1}^{N-1} \cos(i \cdot \theta_{max})\right] + L_{SN} \cdot \cos(N \cdot \theta_{max}) + D_L$$

EXAMPLE

The following example shows how to design the diverter for carrying folded boxes having a length of 272 mm and a width of 240 mm. The boxes were made of corrugated cardboard. Tests showed that the maximum bending angle ($\theta_{max}$) of these boxes is 9 degrees.

When provided in a shingled stream of items, the maximum thickness of the shingled stream for these boxes is 40 mm.

Thus:

$\theta_{max}$=9 degrees $L_{Bmax}$=272 mm $E_{Nmax}$=40 mm

It was also determined that the minimal height of the obstacle is 120 mm ($H_{Omin}$).

The clearance between the incoming conveyor unit and the outgoing conveyor units ($D_L$) was established at 75 mm. Also, the minimum length that a segment can physically have ($L_{Smin1}$) was established at 80 mm. In this example, a segment is considered to be too small to be practical.

The first calculations were done as follows, assuming that all segments will have the same length:

$$\theta_{1 \to N} = \theta_{max} = 9°$$

$$H_O = H_{Omin} = 120 \text{ mm}$$

$$L_{Smin2} = 2 \cdot (L_{Bmax} + E_{Nmax}) \cdot \sin(\theta_{max}/2)$$
$$= 2(272 + 40) \cdot \sin(9°/2)$$
$$= 43.5 \text{ mm}$$

$$L_{Smin} = \text{Maximum}(L_{Smin1}, L_{Smin2})$$
$$= \text{Maximum}(80, 43.5)$$
$$= 80 \text{ mm}$$

$$L_S = (H_O - D_L \cdot \tan[(N+1) \cdot \theta_{max}]) \Big/ \sum_{i=1}^{N} \sin(i \cdot \theta_{max})$$

$$\geq L_{Smin}$$

$$L_S = (120 - 75 \cdot \tan[(N+1) \cdot 9°]) \Big/ \sum_{i=1}^{N} \sin(i \cdot 9°)$$

$$\geq 80 \text{ mm}$$

Thus, using the above equation, one can calculate the length of the segment(s) for different number of segments:

$L_S|_{N=1}$=611 mm (length if one segment is used)

$L_S|_{N=2}$=175 mm (length of each segment for two segments)

$L_S|_{N=3}$=71 mm<80 mm (length of each segment for three segments)

$L_S|_{N=4}$=29 mm<80 mm (length of each segment for four segments)

The above results show that using more than three segments will result in some segments being smaller than the minimum allowable length. One can still use three segments or more but they will need to be at least as long as the minimum allowable length.

The following equations are used to establish the overall length D for a one-, two- or three-segment scenario:

$$D = L_S \cdot \sum_{i=1}^{N} \cos(i \cdot \theta_{max}) + D_L$$

$$D|_{N=1} = 611 \cdot \sum_{i=1}^{1} \cos(i \cdot 9°) + 75 = 679 \text{ mm}$$

-continued $$D\vert_{N=2} = 175 \cdot \sum_{i=1}^{2} \cos(i \cdot 9°) + 75 = 416 \text{ mm}$$

$$D\vert_{N=3} = \text{Maximum}(71, 80) \cdot \sum_{i=1}^{3} \cos(i \cdot 9°) + 75 = 301 \text{ mm}$$

These calculations show that using the three-segment scenario with the minimum length (80 mm) yields the smaller overall length. The space savings can be calculated as follows:

$D\vert_{N=1} - D\vert_{N=2} = 263$ mm
$D\vert_{N=2} - D\vert_{N=3} = 114$ mm
$D\vert_{N=1} - D\vert_{N=3} = 377$ mm It should be noted that where comparing the overall lengths for different scenarios, one can omit the horizontal clearance between the incoming conveyor unit and the outgoing conveyor units.

It is also possible to calculate the lengths of the segments where no all segments have the same lengths. It was found that the overall length of the diverter can be optimized using at least one segments (N≥1) where the first segment(s) at the minimum length and the last segment have a length enough to clear the obstacle.

The calculations are done as follows:

$$\theta_{1\to N} = \theta_{max} = 9°$$
$$H_O = H_{Omin} = 120 \text{ mm}$$
$$L_{Smin2} = 2 \cdot (L_{Bmax} + E_{Nmax}) \cdot \sin(\theta_{max}/2)$$
$$= 2(272 + 40) \cdot \sin(9°/2)$$
$$= 43.5 \text{ mm}$$

$$L_{Smin} = \text{Maximum}(L_{Smin1}, L_{Smin2})$$
$$= \text{Maximum}(80, 43.5)$$
$$= 80 \text{ mm}$$

$$L_{S1\to(N-1)} = L_{Smin} = 80 \text{ mm}$$

$$L_{SN} = \left(H_O - L_{Smin} \cdot \sum_{i=1}^{N-1} \sin(i \cdot \theta_{max}) - D_L \cdot \tan((N+1) \cdot \theta_{max})\right) \Big/ \sin(N \cdot \theta_{max})$$
$$\geq L_{Smin}$$

$$L_{SN} = \left(120 - 80 \cdot \sum_{i=1}^{N-1} \sin(i \cdot 9°) - 75 \cdot \tan((N+1) \cdot 9°)\right) \Big/ \sin(N \cdot 9°)$$
$$\geq 80 \text{ mm}$$

Thus, using the above equation, one can calculate the length of the last segment for different number of segments:

$L_S\vert_{N=2} = 226$ mm
$L_S\vert_{N=3} = 62$ mm<80 mm
$L_S\vert_{N=4} = -48$ mm<80 mm As can be seen, the last segment would be smaller than the minimum length when three segments are used. It is even negative when four segments are used since the height is already reached. The calculations show that the best scenario is the one where the number of segments is two. The overall length is then calculated as follows:

$$D = L_{Smin} \cdot \left[\sum_{i=1}^{N-1} \cos(i \cdot \theta_{max})\right] + L_{SN} \cdot \cos(N \cdot \theta_{max}) + D_L$$

$$D\vert_{N=2} = 80 \cdot \left[\sum_{i=1}^{N-1} \cos(i \cdot 9°)\right] + 226 \cdot \cos(N \cdot 9°) + 75 = 367 \text{ mm}$$

The solution with two segments of different lengths yields a better result (367 mm) than that of the two-segment scenario with identical lengths (416 mm), thus a reduction of 49 mm.

As can be appreciated, the proposed concept provides a way to better design a conveyor system 200 so as to obtain a minimum length without causing a plastic deformation of the items 100 being carried.

The present detailed description and the appended figures are meant to be exemplary only. A skilled person will recognize that variants can be made in light of a review of the present disclosure without departing from the proposed concept. For instance the bias devices could be connected to rollers associated with the bottom conveyor belts instead of or white having biasing devices connected to rollers associated with the top conveyor belts.

What is claimed is:

1. A conveyor system for carrying a shingled stream of items along at least two possible transport paths, the items having a maximum bending angle above which a plastic deformation occurs on at least some of the items, the conveyor system including:
   a pair of juxtaposed outgoing endless-belt conveyor units, each defining a corresponding outgoing portion of the transport paths;
   an incoming endless-belt conveyor unit having a downstream end portion and defining an incoming portion of the transport paths, the downstream end portion of the incoming endless-belt conveyor unit including a first conveyor belt and a second conveyor belt forming juxtaposed first and second conveyor belt runs between which the items are frictionally engaged when carried along the incoming portion of the transport paths, the first and second conveyor belt runs being supported by a plurality of corresponding lengthwise-disposed first and second rollers, respectively; and
   a diverter provided within the downstream end portion of the incoming conveyor unit, the diverter being selectively movable between two angular positions, each angular position corresponding to one of the transport paths, the diverter including a plurality of diverter segments that are lengthwise-juxtaposed with reference to one another and that are each pivotally mounted around a corresponding transversal pivot axis, each diverter segment supporting one of the first rollers for the first conveyor belt run and one of the second rollers for the second conveyor belt run, the first roller of each diverter segment being urged towards the second conveyor belt run using at least one biasing device carried by the corresponding diverter segment, each biasing device generating a biasing force that is independent of the angular position of the corresponding diverter segment.

2. The conveyor system as defined in claim 1, wherein the diverter segments are interconnected to one another using a plurality of linking arms and/or wherein the diverter is configured and sized to have a substantially minimal overall length by having the shingled stream of items curved substantially at the maximum bending angle in the incoming portion of at least one of the transport paths.

3. The conveyor system as defined in claim 1, wherein the conveyor system includes at least one of the following features:
- transversal pivot axes of the diverter segments are parallel to one another, the transversal pivot axes being preferably substantially horizontal;
- each biasing device of the diverter includes a cylinder having a pressurized gas urging a piston towards an extended position;
- each of the outgoing conveyor units includes a first conveyor belt and a second conveyor belt between which the items are frictionally engaged when carried along the transport paths;
- the conveyor system is part of an apparatus for reversing items;
- the items have a non-uniform thickness and/or a non-symmetrical shape when folded;
- the transport paths includes a primary transport path and a branching transport path, the primary transport path being substantially horizontal inside the diverter and the branching transport path being substantially curved, preferably curved upwardly, inside the diverter;
- the items are substantially flat in shape.

4. A conveyor system for carrying a shingled stream of items along at least two possible transport paths, the items having a maximum bending angle above which a plastic deformation occurs on at least some of the items, the conveyor system including:
- a pair of juxtaposed outgoing endless-belt conveyor units, each defining a corresponding outgoing portion of the transport paths;
- an incoming endless-belt conveyor unit having a downstream end portion and defining an incoming portion of the transport paths, the downstream end portion of the incoming endless-belt conveyor unit including a first conveyor belt and a second conveyor belt forming juxtaposed first and second conveyor belt runs between which the items are frictionally engaged when carried along the incoming portion of the transport paths, the first and second conveyor belt runs being supported by a plurality of corresponding lengthwise-disposed first and second rollers, respectively; and
- a diverter provided within the downstream end portion of the incoming conveyor unit, the diverter being selectively movable between two angular positions, each angular position corresponding to one of the transport paths, the diverter being configured and sized to have a substantially minimal overall length by having the shingled stream of items curved substantially at the maximum bending angle in the incoming portion of at least one of the transport paths, the diverter including at least one diverter segment pivotable around a transversal pivot axis, each diverter segment supporting one of the first rollers for the first conveyor belt run and one of the second rollers for the second conveyor belt run, the first roller of each diverter segment being urged towards the second conveyor belt run using at least one biasing device carried by the corresponding diverter segment, each biasing device generating a biasing force that is independent of the angular position of the corresponding diverter segment.

5. The conveyor system as defined in claim 4, wherein the conveyor system includes at least one of the following features:
- transversal pivot axes of the diverter segments are parallel to one another, the transversal pivot axes being preferably substantially horizontal;
- each biasing device of the diverter includes a cylinder having a pressurized gas urging a piston towards an extended position;
- each of the outgoing conveyor units includes a first conveyor belt and a second conveyor belt between which the items are frictionally engaged when carried along the transport paths;
- the conveyor system is part of an apparatus for reversing items;
- the items have a non-uniform thickness and/or a non-symmetrical shape when folded;
- the transport paths includes a primary transport path and a branching transport path, the primary transport path being substantially horizontal inside the diverter and the branching transport path being substantially curved, preferably curved upwardly, inside the diverter;
- the items are substantially flat in shape.

6. The conveyor system as defined in claim 4, wherein the at least one diverter segment includes more than one diverter segment, the diverter segments being lengthwise juxtaposed with reference to one another and pivotally mounted around a corresponding transversal pivot axis, the diverter segments being preferably interconnected to one another using a plurality of linking arms.

7. The conveyor system as defined in claim 6, wherein each diverter segment includes two spaced-apart and substantially L-shaped side members extending parallel to the transport path, the side members of each diverter segment being rigidly connected through a first transversal bar to which the corresponding first roller is mounted, the diverter segments being preferably pivoted using at least one actuator.

8. The conveyor system as defined in claim 7, wherein there are more than one actuator, the actuators being spaced apart from one another and are preferably attached only to a last one of the diverter segments with reference to the transport paths.

9. A method of minimizing the length of a diverter in a conveyor system provided for advancing a shingled stream of items in a direction of travel, the items coming through an incoming conveyor unit and exiting through a selected one among two juxtaposed outgoing conveyor units, the method including:
- determining a maximum bending angle of shingled stream of items, with reference to a tangent axis, above which a plastic deformation is likely to occur;
- determining a minimum vertical height between inlet ends of the two outgoing conveyor units;
- assuming a first number of lengthwise-juxtaposed segment(s) for the diverter and that the shingled stream of items is curved substantially at the maximum bending angle inside the incoming conveyor unit when exiting through one of the outgoing conveyor units;
- determining a length for each segment using the first number; and
- determining again the length for each segment using at least one different number of lengthwise-juxtaposed segment(s) than the first number while still assuming that the shingled stream of items is curved substantially at the maximum bending angle inside the incoming conveyor unit when exiting through one of the outgoing conveyor units.

10. The method as defined in claim 9, wherein the method includes at least one of the following features:
- the step of determining a length for each segment includes calculating an overall length of the diverter for a plurality of numbers of segments;
- the method further includes verifying if the length of one of the segments is smaller than a minimum length.

11. The method as defined in claim 9, wherein the method further includes verifying if the length of one of the segments is smaller than a minimum length, the step of determining a length for each segment including:
- (A) determining the smallest number of segments for which the segments are smaller than the minimum length;
- (B) calculating the overall length using the number of segments determined in (A) and assuming that each segment has the minimum length;
- (C) comparing the overall length calculated in (B) with the overall length for the number of segments that is the number of segments determined in (A) minus one; and
- (D) selecting the length of segments based on the results in (C).

12. The method as defined in claim 9, wherein the step of determining a length for each segment uses the following equations:

$$\theta_{1 \to N} = \theta_{max}$$

$$H_O = H_{Omin}$$

$$L_{Smin2} = 2 \cdot (L_{Bmax} + E_{Nmax}) \cdot \sin\left(\frac{\theta_{max}}{2}\right)$$

$$L_{Smin} = \mathrm{Maximum}(L_{Smin1}, L_{Smin2})$$

$$L_{Si} = \frac{(H_O - D_L \cdot \tan[(N+1) \cdot \theta_{max}])}{\sum_{i=1}^{N} \sin(i \cdot \theta_{max})} \geq L_{Smin}$$

$$D = L_{Si} \cdot \sum_{i=1}^{N} \cos(i \cdot \theta_{max}) + D_L$$

where:
- N: Number of segments;
- $H_O$: Vertical height of the obstacle;
- $H_{Omin}$: Minimal vertical height of the obstacle;
- $L_{Si}$: Length of each segment i;
- $\theta_i$: Angle between successive segments;
- $D_L$: Horizontal clearance between the incoming conveyor unit and the outgoing conveyor units;
- D: Overall length;
- $\theta_{max}$: Maximum bending angle;
- $L_{Bmax}$, $L_{Bmin}$: Maximum and minimum length of the items to be carried;
- $L_{Smin1}$: Minimum length of a segment;
- $E_{Nmax}$: Maximum thickness of the shingled stream.

13. The method as defined in claim 9, wherein the segments are more than one in number and a last one of the segments has a length different from the other(s), the step of determining a length for each segment includes calculating the length of the last segment by assuming a number of lengthwise-juxtaposed segment(s) for the diverter and that the other segments each have a length equal to the minimum length.

14. The method as defined in claim 13, wherein the length of each segment is calculated using the following equations:

$$\theta_{1 \to N} = \theta_{max}$$

$$H_O = H_{Omin}$$

$$L_{Smin2} = 2 \cdot (L_{Bmax} + E_{Nmax}) \cdot \sin\left(\frac{\theta_{max}}{2}\right)$$

$$L_{Smin} = \mathrm{Maximum}(L_{Smin1}, L_{Smin2})$$

$$L_{S1 \to (N-1)} = L_{Smin}$$

$$L_{SN} = \frac{\left(H_O - L_{Smin} \cdot \sum_{i=1}^{N-1} \sin(i \cdot \theta_{max}) - D_L \cdot \tan((N+1) \cdot \theta_{max})\right)}{\sin(N \cdot \theta_{max})}$$

$$\geq L_{Smin}$$

$$D = L_{Smin} \cdot \left[\sum_{i=1}^{N-1} \cos(i \cdot \theta_{max})\right] + L_{SN} \cdot \cos(N \cdot \theta_{max}) + D_L$$

where:
- N: Number of segments;
- $H_O$: Vertical height of the obstacle;
- $H_{Omin}$: Minimal vertical height of the obstacle;
- $L_{S1 \to (N-1)}$: Length of each segment i (where i≠N);
- $\theta_i$: Angle between successive segments;
- $D_L$: Horizontal clearance between the incoming conveyor unit and the outgoing conveyor units;
- D: Overall length;
- $\theta_{max}$: Maximum bending angle;
- $L_{Bmax}$, $L_{Bmin}$: Maximum and minimum length of the items to be carried;
- $L_{Smin1}$: Minimum length that a segment can physically have;
- $L_{SN}$: Length of the last segment; and
- $E_{Nmax}$: Maximum thickness of the shingled stream.

15. The method as defined in claim 13, wherein the step of determining the length of the last segment includes calculating an overall length of the diverter for a plurality of numbers of segments.

16. The method as defined in claim 15, wherein the step of determining the length for the last segment further includes determining the smallest number of segments for which the last segment is at least equal to the minimum length.

* * * * *